(12) United States Patent
Son et al.

(10) Patent No.: US 11,943,976 B2
(45) Date of Patent: Mar. 26, 2024

(54) DISPLAY DEVICE

(71) Applicant: Samsung Display Co., LTD., Yongin-si (KR)

(72) Inventors: Seung Sok Son, Goyang-si (KR); Woo Geun Lee, Suwon-si (KR); Seul Ki Kim, Incheon (KR); Kap Soo Yoon, Seoul (KR); Hyun Woong Baek, Seoul (KR); Jae Hyun Lee, Gwacheon-si (KR); Su Jung Jung, Yongin-si (KR); Jung Kyoung Cho, Seongnam-si (KR); Seung Ha Choi, Hwaseong-si (KR); June Whan Choi, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 102 days.

(21) Appl. No.: 16/892,988

(22) Filed: Jun. 4, 2020

(65) Prior Publication Data

US 2021/0091163 A1   Mar. 25, 2021

(30) Foreign Application Priority Data

Sep. 23, 2019   (KR) ......................... 10-2019-0116532

(51) Int. Cl.
  *G02F 1/1362*   (2006.01)
  *G09G 3/32*   (2016.01)
  (Continued)

(52) U.S. Cl.
  CPC ............. *H10K 59/131* (2023.02); *G09G 3/32* (2013.01); *G09G 2300/0426* (2013.01); *G09G 2310/0202* (2013.01); *H10K 59/1201* (2023.02)

(58) Field of Classification Search
  CPC . H01L 27/3276; H01L 2227/323; G09G 3/32; G09G 2300/042; G09G 2300/06; G09G 2310/0202
  See application file for complete search history.

(56) References Cited

U.S. PATENT DOCUMENTS

2008/0291349 A1* 11/2008 Kim .................... G02F 1/13458
  349/152
2011/0074749 A1* 3/2011 Higashi ............... H01L 27/3276
  345/206

(Continued)

FOREIGN PATENT DOCUMENTS

CN   103579532 A  * 2/2014 ........... H01L 27/323
CN   104241325    12/2014
(Continued)

*Primary Examiner* — Lin Li
(74) *Attorney, Agent, or Firm* — KILE PARK REED & HOUTTEMAN PLLC

(57) ABSTRACT

A display device includes a substrate, a first conductive layer on the substrate, the first conductive layer including a data signal line, a first insulating layer on the first conductive layer, a semiconductor layer on the first insulating layer, the semiconductor layer including a first semiconductor pattern, a second insulating layer on the semiconductor layer, and a second conductive layer on the second insulating layer, the second conductive layer including a gate electrode disposed to overlap the first semiconductor pattern, a transistor first electrode disposed to overlap a part of the first semiconductor pattern, wherein the transistor first electrode is electrically connected to the data signal line through a contact hole that penetrates the first and second insulating layers, and a transistor second electrode disposed to overlap another part of the first semiconductor pattern.

20 Claims, 24 Drawing Sheets

(51) Int. Cl.
*H10K 59/121* (2023.01)
*H10K 59/131* (2023.01)
*H10K 59/38* (2023.01)
*H10K 59/12* (2023.01)

(56) References Cited

U.S. PATENT DOCUMENTS

| | | | | |
|---|---|---|---|---|
| 2012/0074423 | A1* | 3/2012 | Kanegae | H01L 27/3276 |
| | | | | 257/E33.053 |
| 2014/0367664 | A1* | 12/2014 | Park | H10K 59/38 |
| | | | | 438/34 |
| 2018/0033851 | A1* | 2/2018 | Kim | H10K 59/131 |
| 2018/0062105 | A1* | 3/2018 | Lius | H10K 59/1213 |
| 2019/0129548 | A1* | 5/2019 | Hwang | G06F 3/04164 |
| 2019/0131369 | A1* | 5/2019 | Choi | H10K 59/131 |
| 2019/0164999 | A1* | 5/2019 | Choi | G02F 1/136209 |
| 2019/0189974 | A1* | 6/2019 | Gunji | H10K 59/122 |
| 2020/0343471 | A1 | 10/2020 | Lius et al. | |

FOREIGN PATENT DOCUMENTS

| | | |
|---|---|---|
| CN | 107665951 | 2/2018 |
| CN | 109841650 | 6/2019 |

\* cited by examiner

DISPLAY DEVICE

CROSS-REFERENCE TO RELATED APPLICATION(S)

This application claims priority to and benefits of Korean Patent Application No. 10-2019-0116532 under 35 U.S.C. § 119, filed in the Korean Intellectual Property Office on Sep. 23, 2019, the entire contents of which are incorporated herein by reference.

BACKGROUND

1. Technical Field

The disclosure relates to a display device.

2. Description of the Related Art

An electronic device such as a television (TV), a smartphone, a tablet personal computer (PC), a digital camera, a laptop computer, or a navigation device that provides an image or images to a user includes a display device for displaying an image or images.

The display device may include pixels and pixel circuits for driving the pixels. The pixel circuits may be formed using wires and thin-film transistors (TFTs), which may be provided on an insulating substrate. Wire pads may be provided at the ends of the wires, and an external device may be mounted on the wire pads.

The display device may be formed by multiple mask processes. Mask processes may be useful for patterning wires or insulating films. However, as the number of mask processes used increases, process efficiency may decrease and cost may increase.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments provide a method of manufacturing a display device with improved process efficiency.

Embodiments also provide a display device with highly reliable wire pads.

However, embodiments of the disclosure are not limited to those set forth herein. The above and other embodiments will become more apparent to one of ordinary skill in the art to which the disclosure pertains by referencing the detailed description of the disclosure given below.

According to an embodiment, a display device may include a substrate; a first conductive layer disposed on the substrate, the first conductive layer including a data signal line; a first insulating layer disposed on the first conductive layer; a semiconductor layer disposed on the first insulating layer, the semiconductor layer including a first semiconductor pattern; a second insulating layer disposed on the semiconductor layer; and a second conductive layer disposed on the second insulating layer, the second conductive layer including a gate electrode disposed to overlap the first semiconductor pattern, a transistor first electrode disposed to overlap a part of the first semiconductor pattern, wherein the transistor first electrode is electrically connected to the data signal line through a contact hole that penetrates the first and second insulating layers, and a transistor second electrode disposed to overlap another part of the first semiconductor pattern.

In an embodiment, the second conductive layer may further include a scan signal line, and the gate electrode may branch off from the scan signal line.

In an embodiment, the data signal line may extend in a first direction, and the scan signal line may extend in a second direction that intersects the first direction.

In an embodiment, the gate electrode may extend in the first direction.

In an embodiment, the first conductive layer may further include a data pad provided at an end of the data signal line.

In an embodiment, the second conductive layer may further include a pad electrode that overlaps the data pad.

In an embodiment, the pad electrode may be electrically connected to the data pad through a contact hole that penetrates the first and second insulating layers.

In an embodiment, the display device may include a conductive capping layer disposed on the second conductive layer.

In an embodiment, the conductive capping layer may include a ZIO film, an IZO film, an ITO film, or a Ti/Mo/ITO film.

In an embodiment, the pad electrode may be in electrical contact with the conductive capping layer. In an embodiment, the pad electrode may include copper.

In an embodiment, the gate electrode, the transistor first electrode, and the transistor second electrode may be spaced apart from one another.

In an embodiment, the transistor first electrode may be electrically connected to the part of the first semiconductor pattern through a contact hole that penetrates the second insulating layer.

In an embodiment, the semiconductor layer may further include a second semiconductor pattern disposed apart from the first semiconductor pattern.

In an embodiment, the first conductive layer may further include a first power supply wire, and the first power supply wire may be disposed to overlap a part of the second semiconductor pattern and may be electrically connected to the part of the second semiconductor pattern through the contact hole that penetrates the first and second insulating layers.

According to an embodiment, a display device may include a substrate, a first conductive layer disposed on the substrate, a first insulating layer disposed on the first conductive layer, a semiconductor layer disposed on the first insulating layer, a second insulating layer disposed on the semiconductor layer, a second conductive layer disposed on the second insulating layer, a third insulating layer disposed on the second conductive layer, and a third conductive layer disposed on the third insulating layer, a light-emitting element disposed in pixels; a driving transistor providing a driving current to the light-emitting element; and a first switching transistor transmitting a data signal to a gate electrode of the driving transistor, wherein the first conductive layer may include a first power supply wire electrically connected to a driving transistor first electrode of the driving transistor, and a data signal line electrically connected to a first switching transistor first electrode of the first switching transistor, the semiconductor layer may include a first semiconductor pattern disposed to overlap the first power supply wire, and a second semiconductor pattern disposed apart from the first semiconductor pattern, and the second conductive layer may include the first switching transistor first electrode and the driving transistor first electrode.

In an embodiment, a part of the second semiconductor pattern may overlap the data signal line.

In an embodiment, the second conductive layer may further include a scan signal line that transmits a scan signal to a gate electrode of the first switching transistor.

In an embodiment, the data signal line and the first power supply wire may extend in a first direction, and the scan signal line may extend in a second direction that intersects the first direction.

In an embodiment, the display device may include a second switching transistor transmitting a sensing signal to an electrode of the driving transistor, wherein the second conductive layer may further include a sensing signal line which may transmit the sensing signal to a gate electrode of the second switching transistor.

In an embodiment, the third conductive layer may be electrically connected to the driving transistor first electrode through a contact hole that penetrates the third insulating layer.

According to the aforementioned and other embodiments, since the gate electrode and the first and second electrodes of each transistor may be formed by the same mask process, an additional mask process may not be needed, and as a result, process efficiency may be improved.

Since a conductive capping layer on a second conductive layer may be used as the contact electrode of a wire pad, an additional mask process may not be needed, and as a result, process efficiency may be improved.

Moreover, a conductive layer that forms the wire pad may be prevented from being in direct contact with a reactive material, and as a result, reliability may be improved.

Other features and embodiments may be apparent from the following detailed description, the drawings, and the claims.

BRIEF DESCRIPTION OF THE DRAWINGS

The above and other embodiments and features of the disclosure will become more apparent by describing in detail embodiments thereof with reference to the attached drawings, in which.

DETAILED DESCRIPTION OF THE EMBODIMENTS

Figure 1:
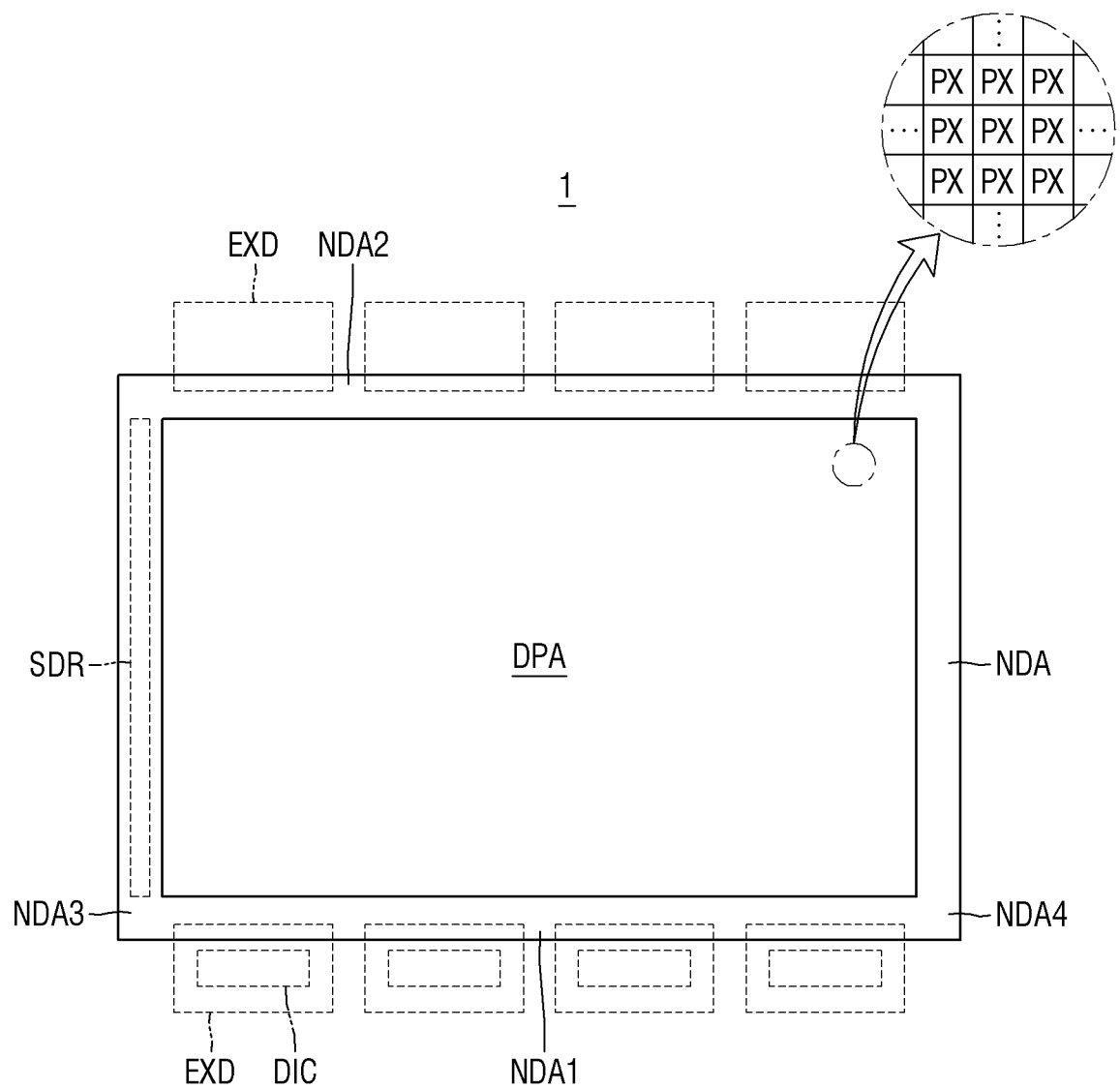
FIG. 1 is a plan view of a display device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

Some of the parts which are not associated with the description may not be provided in order to describe embodiments of the disclosure and like reference numerals refer to like elements throughout the specification.

When a layer, film, region, substrate, or area, is referred to as being "on" another layer, film, region, substrate, or area, it may be directly on the other film, region, substrate, or area, or intervening films, regions, substrates, or areas, may be present therebetween. Conversely, when a layer, film, region, substrate, or area, is referred to as being "directly on" another layer, film, region, substrate, or area, intervening layers, films, regions, substrates, or areas, may be absent therebetween. Further when a layer, film, region, substrate, or area, is referred to as being "below" another layer, film, region, substrate, or area, it may be directly below the other layer, film, region, substrate, or area, or intervening layers, films, regions, substrates, or areas, may be present therebetween. Conversely, when a layer, film, region, substrate, or area, is referred to as being "directly below" another layer, film, region, substrate, or area, intervening layers, films, regions, substrates, or areas, may be absent therebetween. Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Throughout the specification, when an element is referred to as being "connected" to another element, the element may be "directly connected" to another element, or "electrically connected" to another element with one or more intervening elements interposed therebetween. It will be further understood that when the terms "comprises," "comprising," "includes" and/or "including" are used in this specification, they or it may specify the presence of stated features, integers, steps, operations, elements and/or components, but do not preclude the presence or addition of other features, integers, steps, operations, elements, components, and/or any combination thereof.

In the drawings, sizes and thicknesses of elements may be enlarged for better understanding, clarity, and ease of description thereof. However, the disclosure is not limited to the illustrated sizes and thicknesses. In the drawings, the thicknesses of layers, films, panels, regions, and other elements, may be exaggerated for clarity. In the drawings, for better understanding and ease of description, the thicknesses of some layers and areas may be exaggerated.

Further, in the specification, the phrase "in a plan view" means when an object portion is viewed from above, and the phrase "in a schematic cross-sectional view" means when a schematic cross-section taken by vertically cutting an object portion is viewed from the side.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

Unless otherwise defined, all terms (including technical and scientific terms) used herein have the same meaning as commonly understood by one of ordinary skill in the art to which embodiments pertain. In addition, it will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Embodiments will hereinafter be described with reference to the accompanying drawings.

FIG. 1 is a plan view of a display device according to an embodiment.

Referring to FIG. 1, examples of a display device 1 may include many varieties or types of electronic devices that may provide a display screen or screens. For example, the display device 1 may be a television (TV), a notebook computer, a monitor, a billboard, a mobile phone, a smartphone, a tablet personal computer (PC), an electronic watch, a smart watch, a watchphone, a mobile communication terminal, an electronic notepad, an electronic book reader, a portable multimedia player (PMP), a navigation device, a gaming console, a digital camera, an Internet-of-Things (IoT) device, or the like within the spirit and the scope of the disclosure.

The display device 1 is illustrated as being a TV, but the disclosure is not limited thereto. The display device 1 may have a high or ultra-high definition of 4K, 8K, or the like within the spirit and the scope of the disclosure.

The display device 1 may be classified according to how it displays an image or images. For example, the display device 1 may be classified as an organic light-emitting diode (OLED) display device, an inorganic electroluminescent (EL) display device, a quantum-dot light-emitting diode (QED) display device, a micro-light-emitting diode (micro-LED) display device, a plasma display panel (PDP) display device, a field emission display (FED) device, a cathode ray tube (CRT) display device, a liquid crystal display (LCD) device, or an electrophoretic display (EPD) device. The display device 1 will hereinafter be described as being, for example, an OLED display device, but the disclosure is not limited thereto. For example, the display device 1 may also be applicable to various other display devices than an OLED display device without departing from the spirit and scope of the disclosure.

The display device 1 may have a substantially rectangular shape in a plan view. In a case where the display device 1 is a TV, the display device 1 may be arranged so that its long sides may be aligned in a horizontal direction, but the disclosure is not limited thereto. Alternatively, the display device 1 may be arranged so that its long sides may be aligned in a vertical direction. Alternatively, the display device 1 may be rotatably installed so that its long sides may be aligned variably either in the horizontal direction or in the vertical direction.

The display device 1 may include a display area DPA and a non-display area NDA. The display area DPA may be an active region in which an image or images may be displayed. The display area DPA, like the display device 1, may have a substantially rectangular shape in a plan view.

The display area DPA may include pixels PX. The pixels PX may be arranged in row and column directions. The pixels PX may have a substantially rectangular or square shape in a plan view, but the disclosure is not limited thereto.

Alternatively, the pixels PX may have a substantially rhombus shape in a plan view so that the sides of each of the pixels PX may be inclined with respect to the sides of the display device 1. The pixels PX may include multiple groups of pixels PX that may display different colors. For example, the pixels PX may include first, second, and third color pixels, which may be red, green, and blue pixels, respectively, but the disclosure is not limited thereto. The pixels PX may be alternately arranged in a stripe or PenTile arrangement.

The non-display area NDA may be located or disposed on the periphery of the display area DPA. The non-display area NDA may surround the entire display area DPA or part of the display area DPA. The display area DPA may have a substantially rectangular shape, and the non-display area NDA may be located or disposed adjacent to all four sides of the display area DPA. The non-display area NDA may form the bezel of the display device 1, for example.

Driving circuits or driving elements for driving the display area DPA may be located or disposed in the non-display area NDA. For example, in first and second non-display areas NDA1, NDA2 adjacent to first and second long sides (e.g., the lower and upper sides), respectively, of the display device 1, a pad area may be provided on a display substrate of the display device 1, and external devices EXD may be mounted on pad electrodes of the pad area. Examples of the external devices EXD may include a connecting film, a printed circuit board (PCB), a driving integrated chip (DIC), a connector, a wire connecting film, and the like. For example, in a third non-display area NDA3 adjacent to a first short side (e.g., the left side) of the display device 1, a scan driver SDR may be formed directly on the display substrate of the display device 1.

Figure 2:
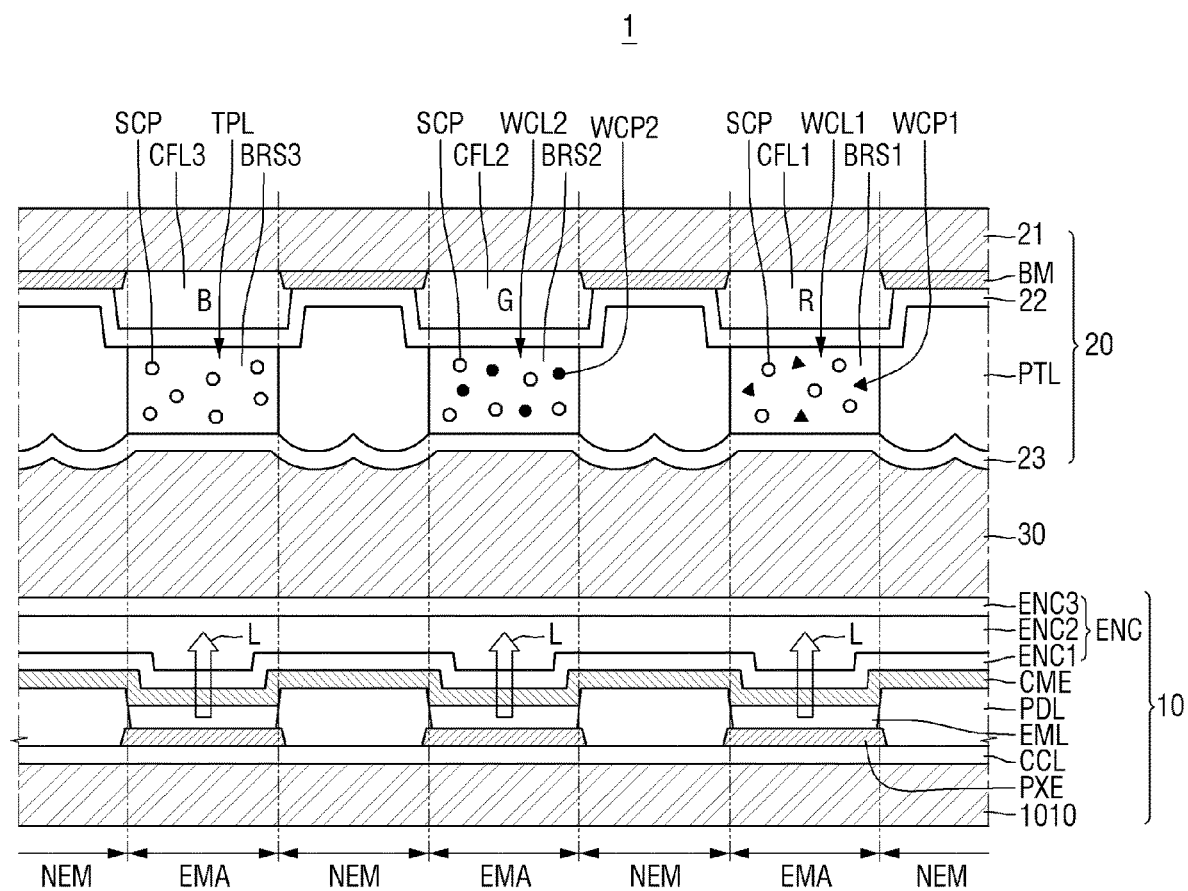
FIG. 2 is a schematic cross-sectional view of the display device of FIG. 1.

FIG. 2 is a schematic cross-sectional view of the display device of FIG. 1.

FIG. 2 illustrates a top emission-type display device which emits light L in a direction away from a first substrate 1010 where emission layers EML may be formed (i.e., in a direction toward a second substrate 21), but the disclosure is not limited thereto.

Referring to FIG. 2, the display device 1 may include the emission layers EML, an encapsulation film ENC which may cover the emission layers EML, and a color control structure (WCL, TPL, and CFL) which may be located or disposed on the encapsulation film ENC. The display device 1 may include a first display substrate 10 and a second display substrate 20 which may be opposite to the first display substrate 10. The emission layers EML, the encapsulation film ENC, and the color control structure (WCL, TPL, and CFL) may be included in, for example, one of the first and second display substrates 10 and 20.

For example, the first display substrate 10 may include the first substrate 1010, the emission layers EML which may be located or disposed on a first surface of the first substrate 1010, and the encapsulation film ENC which may be located or disposed on the emission layers EML. For example, the second display substrate 20 may include the second substrate 21 and the color control structure (WCL, TPL, and CFL) which may be located or disposed on a first surface of the second substrate 21 that may face the first substrate 1010. The color control structure (WCL, TPL, and CFL) may include color filter layers CFL and wavelength conversion layers WCL. The color control structure (WCL, TPL, and CFL) may include a light-transmitting layer TPL which may be located or disposed in some pixels to be on a level with the wavelength conversion layers WCL.

A filler layer 30 may be located or disposed between the encapsulation film ENC and the color control structure (WCL, TPL, and CFL). The filler layer 30 may bond the first and second display substrates 10 and 20 while filling the space between the first and second display substrates 10 and 20.

The first substrate 1010 of the first display substrate 10 may be an insulating substrate. The first substrate 1010 may include a transparent material. For example, the first substrate 1010 may include a transparent insulating material such as glass, quartz, or the like. The first substrate 1010 may be a rigid substrate, but the disclosure is not limited thereto. Alternatively, the first substrate 1010 may include a plastic material such as polyimide and may have flexibility, in which case, the first substrate 1010 may be bendable, foldable, or rollable, or generally flexible.

Pixel electrodes PXE may be located or disposed on the first surface of the first substrate 1010. The pixel electrodes PXE may be located or disposed in the respective pixels PX. The pixel electrodes PXE may be separated between adjacent pixels PX. The circuit layer CCL, which may drive the pixels PX, may be located or disposed on the first substrate 1010. The circuit layer CCL may be located or disposed between the first substrate 1010 and the pixel electrodes PXE. The circuit layer CCL will be described later in detail.

The pixel electrodes PXE may be the first electrodes of light-emitting elements, e.g., anode electrodes. The pixel electrodes PXE may have a stack of a layer of a high-work function material such as indium tin oxide (ITO), indium zinc oxide (IZO), zinc oxide (ZnO), or indium oxide ($In_2O_3$) and a layer of a reflective material such as silver (Ag), magnesium (Mg), aluminum (Al), platinum (Pt), lead (Pb), gold (Au), nickel (Ni), neodymium (Nd), iridium (Ir), chromium (Cr), lithium (Li), calcium (Ca), or a mixture thereof. The high-work function material layer may be located or disposed on the reflective material layer to be closer than the reflective material layer to the emission layers EML. The pixel electrodes PXE may have a multilayer structure of ITO/Mg, ITO/MgF, ITO/Ag, or ITO/Ag/ITO, but the disclosure is not limited thereto.

A pixel-defining film PDL may be located or disposed on the first surface of the first substrate 1010 along the boundaries between the pixels PX. The pixel-defining film PDL may be located or disposed on the pixel electrodes PXE and may include openings which may expose the pixel electrodes PXE. Due to the pixel-defining film PDL and the openings of the pixel-defining film PDL, emission areas EMA and non-emission areas NEM may be defined. The pixel-defining film PDL may include an organic insulating material such as an acrylic resin, an epoxy resin, a phenolic resin, a polyamide resin, a polyimide resin, an unsaturated polyester resin, a polyphenylene ether resin, a polyphenylene sulfide resin, or benzocyclobutene (BCB). The pixel-defining film PDL may include an inorganic material.

The emission layers EML may be located or disposed on the pixel electrodes PXE exposed by the pixel-defining film PDL. In a case where the display device 1 is an OLED display device, the emission layers EML may include an organic layer including an organic material. The organic layer may include an organic light-emitting layer and may include a hole injection/transport layer and/or an electron injection/transport layer as auxiliary layers for assisting the emission of light within the spirit and the scope of the disclosure. In a case where the display device 1 is an LED display device, the emission layers EML may include an inorganic material such as an inorganic semiconductor.

In an embodiment, each of the emission layers EML may have a tandem structure in which organic light-emitting layers may be stacked in a thickness direction with charge generating layers located or disposed therebetween. The organic light-emitting layers may emit light of the same wavelength or may emit light of different wavelengths. At least some of the layers of each of the emission layers EML may be separated between adjacent pixels PX.

The emission layers EML may all emit light of the same color in all the pixels PX. For example, the emission layers EML may emit blue light or ultraviolet (UV) light, and the wavelength conversion layers WCL of the color control structure (WCL, TPL, and CFL) may control the pixels PX to display different colors.

Alternatively, the wavelength of light emitted by each of the emission layers EML may differ from one pixel PX to another pixel PX. For example, the emission layers EML may emit light of a first color in a first color pixel, light of a second color in a second color pixel, and light of a third color in a third color pixel.

A common electrode CME may be located or disposed on the emission layers EML. The common electrode CME may be in contact not only with the emission layers EML, but also with the top surface of the pixel-defining film PDL.

The common electrode CME may be electrically connected throughout the pixels PX. The common electrode CME may be located or disposed on the entire surface of the first substrate 1010 regardless of the distinction between the pixels PX. The common electrode CME may be the second electrode of each of the light-emitting elements, e.g., a cathode electrode.

The common electrode CME may include a layer of a low-work function material such as Li, Ca, LiF/Ca, LiF/Al, Al, Mg, Ag, Pt, Pd, Ni, Au, Nd, Ir, Cr, BaF, Ba, or a compound or mixture thereof (e.g., the mixture of Ag and Mg). The common electrode CME may include a transparent metal oxide layer which may be located or disposed on the low-work function material layer.

The pixel electrodes PXE, the emission layers EML, and the common electrode CME may form the light-emitting elements (e.g., OLEDs). Light may be emitted upwardly from the emission layers EML through the common electrode CME.

The encapsulation film ENC may be located or disposed on the common electrode CME. The encapsulation film ENC may include at least one encapsulation layer. For example, the encapsulation layer may include a first inorganic film ENC1, an organic film ENC2, and a second inorganic film ENC3. The first and second inorganic films ENC1 and ENC3 may include silicon nitride, silicon oxide, or silicon oxynitride. The organic film ENC2 may include an organic insulating material such as an acrylic resin, an epoxy resin, a phenolic resin, a polyamide resin, a polyimide resin, an unsaturated polyester resin, a polyphenylene ether resin, a polyphenylene sulfide resin, or BCB.

The second display substrate 20 may be located or disposed on the encapsulation film ENC to face the encapsulation film ENC. The second substrate 21 of the second display substrate 20 may include a transparent material. The second substrate 21 may include a transparent insulating material such as glass or quartz. The second substrate 21 may be a rigid structure, but the disclosure is not limited thereto. Alternatively, the second substrate 21 may include a plastic material such as polyimide and may have flexibility, in which case, the first substrate 1010 may be bendable, foldable, or rollable, or generally flexible.

The second substrate 21 may be the same as the first substrate 1010 or may differ from the first substrate 1010 in material, thickness, and transmissivity thereof. For example, the second substrate 21 may have a higher transmissivity than the first substrate 1010 and may be thicker or thinner than the first substrate 1010.

A light-blocking member BM may be located or disposed on the first surface of the second substrate 21 along the boundaries between the pixels PX. The light-blocking member BM may overlap the pixel-defining film PDL and may be located or disposed in the non-emission areas NEM. The light-blocking member BM may include openings which may expose portions of the first surface of the second substrate 21 that overlap the emission areas EMA. The light-blocking member BM may be formed in a lattice shape in a plan view.

The light-blocking member BM may include an organic material. The light-blocking member BM may absorb external light and may thus reduce color distortions that may be caused by the reflection of external light. The light-blocking member BM may prevent light emitted from the emission layers EML from infiltrating into adjacent pixels PX.

The light-blocking member BM may absorb all visible wavelengths. The light-blocking member BM may include a light-absorbing material. For example, the light-blocking member BM may be formed of a material that may be used as a black matrix.

The color filter layers CFL may be located or disposed on the first surface of the second substrate 21 where the light-blocking member BM is disposed. The color filter layers CFL may be located or disposed on portions of the first surface of the second substrate 21 that may be exposed by the openings of the light-blocking member BM. The color filter layers CFL may be located or disposed on the light-blocking member BM.

The color filter layers CFL may include a first color filter layer CFL1 which may be located or disposed in a first color pixel, a second color filter layer CFL2 which may be located or disposed in a second color pixel, and the third color filter layer CFL3 which may be located or disposed in a third color pixel. Each of the first, second, and third color filter layers CFL1, CFL2, and CFL3 may include a colorant such as a pigment or dye that may absorb all wavelengths except for a particular wavelength. The first, second, and third color filter layers CFL1, CFL2, and CFL3 may be red, green, and blue color filter layers, respectively, but the disclosure is not limited thereto. Adjacent color filter layers CFL are illustrated as being spaced apart from one another over the light-blocking member BM, but may partially overlap one another over the light-blocking member BM.

A first capping layer 22 may be located or disposed on the color filter layers CFL. The first capping layer 22 may prevent impurities such as moisture or air from penetrating and contaminating the color filter layers CFL. The first capping layer 22 may prevent the diffusion of the colorants of the color filter layers CFL.

The first capping layer 22 may be in direct contact with first surfaces (i.e., the bottom surfaces) of the color filter layers CFL. The first capping layer 22 may be formed of an inorganic material. For example, the first capping layer 22 may include silicon nitride, aluminum nitride, zirconium nitride, titanium nitride, hafnium nitride, tantalum nitride, silicon oxide, aluminum oxide, titanium oxide, tin oxide, or silicon oxynitride.

A barrier wall PTL may be located or disposed on the first capping layer 22. The barrier wall PTL may be located or disposed in the non-emission areas NEM. The barrier wall PTL may be located or disposed to overlap the light-blocking member BM. The barrier wall PTL may include openings which may expose the color filter layers CFL. The barrier wall PTL may include a photosensitive organic material, but the disclosure is not limited thereto. The barrier wall PTL may include a light-shielding material.

The wavelength conversion layers WCL and/or the light-transmitting layer TPL may be located or disposed in spaces exposed by the openings of the barrier wall PTL. The wavelength conversion layers WCL and the light-transmitting layer TPL may be formed by inkjet printing using the barrier walls PTL as banks, but the disclosure is not limited thereto.

In a case where the emission layers EML emit light of the third color, the wavelength conversion layers WCL may include first and second wavelength conversion patterns WCL1 and WCL2 which may be located or disposed in the first and second color pixels, respectively. The light-transmitting layer TPL may be located or disposed in the third color pixel.

The first wavelength conversion pattern WCL1 may include a first base resin BRS1 and a first wavelength conversion material WCP1 which may be located or disposed in the first base resin BRS1. The second wavelength conversion pattern WCL2 may include a second base resin BRS2 and a second wavelength conversion material WCP2 which may be located or disposed in the second base resin BRS2. The light-transmitting layer TPL may include a third base resin BRS3 and a scatterer SCP which may be located or disposed in the third base resin BRS3.

The first, second, and third base resins BRS1, BRS2, and BRS3 may include a light-transmitting organic material. For example, the first, second, and third base resins BRS1, BRS2, and BRS3 may include an epoxy resin, an acrylic resin, a cardo resin, or an imide resin. The first, second, and third base resins BRS1, BRS2, and BRS3 may be formed of the same or similar material, but the disclosure is not limited thereto.

The scatterer SCP may be particles of a metal oxide or particles of an organic material. Here, the metal oxide may be titanium oxide ($TiO_2$), zirconium oxide ($ZrO_2$), aluminum oxide ($Al_2O_3$), indium oxide ($In_2O_3$), zinc oxide (ZnO), or tin oxide ($SnO_2$), and the organic material may be an acrylic resin or a urethane resin.

The first wavelength conversion material WCP1 may convert the third color into the first color, and the second wavelength conversion material WCP2 may convert the third color into the second color. The first and second wavelength conversion materials WCP1 and WCP2 may be quantum dots, quantum rods, or phosphors. The quantum dots may include a group IV nanocrystal material, a group II-VI compound nanocrystal material, a group III-V compound nanocrystal material, a group IV-VI nanocrystal material, or a combination thereof. Each of the first and second wavelength conversion patterns WCL1 and WCL2 may include a scatterer SCP which may improve the wavelength conversion efficiency of the first and second wavelength conversion patterns WCL1 and WCL2.

The light-transmitting layer TPL, which may be located or disposed in the third color pixel, transmits therethrough light of the third color incident thereupon from the emission layers EML while maintaining the wavelength of the incident light. The scatterer SCP of the light-transmitting layer TPL may control the path of light emitted through the light-transmitting layer TPL. The light-transmitting layer TPL may not include a wavelength conversion material.

A second capping layer 23 may be located or disposed on the wavelength conversion layers WCL and the light-transmitting layer TPL. The second capping layer 23 may be formed of an inorganic material. The second capping layer 23 may include one selected from among the aforementioned materials for forming the first capping layer 22. The second capping layer 23 may be formed of the same or similar material as the first capping layer 22, but the disclosure is not limited thereto.

The filler layer 30 may be located or disposed between the first and second display substrates 10 and 20. The filler layer 30 may fill the space between the first and second display substrates 10 and 20 and may bond the first and second display substrates 10 and 20. The filler layer 30 may be located or disposed between the encapsulation film ENC of the first display substrate 1010 and the second capping layer 23 of the second display substrate 20. The filler layer 30 may be formed of a Si-based organic material or an epoxy-based organic material, but the disclosure is not limited thereto.

The circuit layer CCL of the display device 1 will hereinafter be described.

Figure 3:
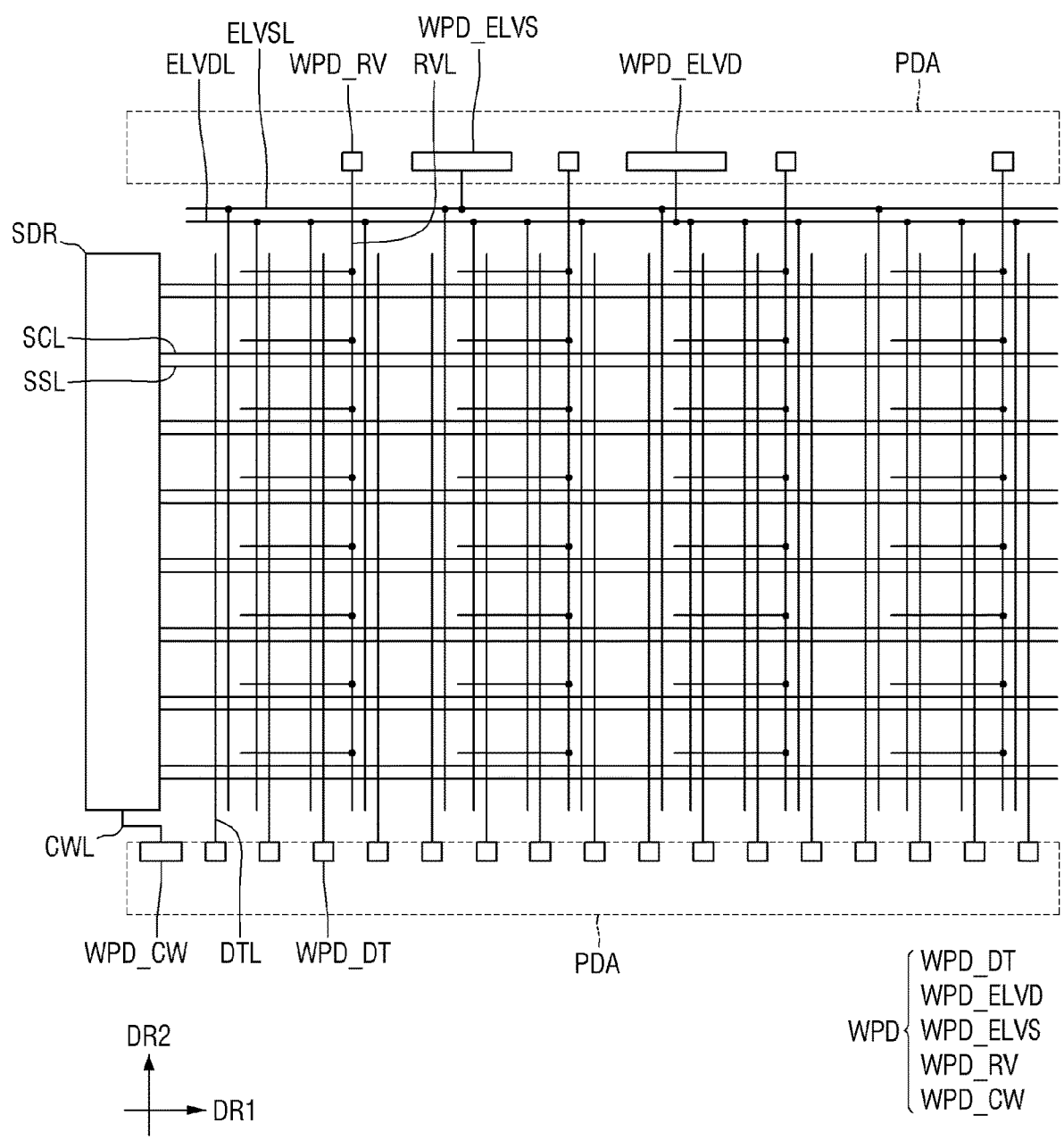
FIG. 3 is a layout view of a circuit layer of a first display substrate of the display device of FIG. 1.

FIG. 3 is a layout view of the circuit layer of the first display substrate of the display device of FIG. 1.

Referring to FIG. 3, wires may be located or disposed on the first substrate 1010 of the first display substrate 10. The wires may include scan lines SCL, sensing signal lines SSL, data lines DTL, reference voltage lines RVL, a first power supply line ELVDL, and a second power supply line ELVSL.

The scan lines SCL and the sensing signal lines SSL may extend in a first direction DR1. The scan lines SCL and the sensing signal lines SSL may be electrically connected to the scan driver SDR. The scan driver SDR may include driving circuitry which consists of the circuit layer CCL. The scan driver SDR may be located or disposed in the third non-display area of the first substrate 1010, but the disclosure is not limited thereto. Alternatively, the scan driver SDR may be located or disposed in the fourth non-display area NDA4, which may be on a second short side (e.g., the right side) of the display device 1, or in both the third NDA3 and fourth NDA4 non-display areas. The scan driver SDR may be electrically connected to a signal connecting wire CWL, and at least a first end of the signal connecting wire CWL may form a pad WPD_CW in the first non-display area NDA1 and/or in the second non-display area NDA2 and may thus be electrically connected to the external devices EXD of FIG. 1.

The data lines DTL and the reference voltage lines RVL may extend in a second direction DR2 which may intersect the first direction DR1. The first and second power supply lines ELVDL and ELVSL may include portions extending in the second direction DR2. The first and second power supply lines ELVDL and ELVSL may include portions extending in the first direction DR1. The first and second power supply lines ELVDL and ELVSL may have a mesh structure, but the disclosure is not limited thereto.

Wire pads WPD may be located or disposed at least first ends of the data lines DTL, the reference voltage lines RVL, and the first and second power supply lines ELVDL and ELVSL. The wire pads WPD may be located or disposed in the non-emission areas NDA. Wire pads WPD_DT (hereinafter, the data pads WPD_DT) of the data lines DTL may be located or disposed in the first non-display area NDA1, and wire pads WPD_RV (hereinafter, the reference voltage pads WPD_RV) of the reference voltage lines RVL, a wire pad WPD_ELVD (hereinafter, the first power supply pad WPD_ELVD) of the first power supply line ELVDL, and a wire pad WPD_ELVS (hereinafter, the second power supply pad WPD_ELVS) of the second power supply line ELVSL) may be located or disposed in the second non-display area NDA2. Alternatively, the data pads WPD_DT, the reference voltage pads WPD_RV, the first power supply pad WPD_ELVD, and the second power supply pad WPD_ELVS may all be located or disposed in the same area, e.g., in the first non-display area NDA1. The external devices EXD of FIG. 1 may be mounted on the wire pads WPD. The external devices EXD may be mounted on the wire pads WPD via anisotropic conductive films or via ultrasonic bonding, but the disclosure is not limited thereto.

The pixels PX on the first substrate 1010 may include pixel driving circuits. The aforementioned wires may pass through or around the pixels PX to apply driving signals to the pixel driving circuits. Each of the pixel driving circuits may include one or more transistors and one or more capacitors. The numbers of transistors and capacitors provided in each of the pixel driving circuits may vary. The pixel driving circuits will hereinafter be described as having a "3T1C" structure consisting of three transistors and one capacitor, but the disclosure is not limited thereto. For example, various other structures such as a "2T1C" structure, a "7T1C" structure, or a "6T1C" structure may also be applicable to the pixels PX.

Figure 4:
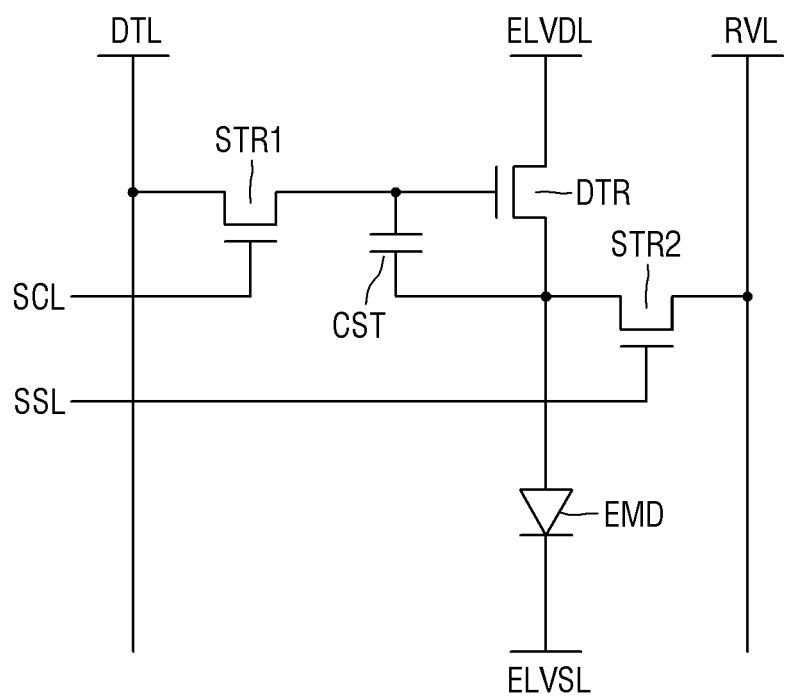
FIG. 4 is an equivalent circuit diagram of a pixel of the display device of FIG. 1.

FIG. 4 is an equivalent circuit diagram of a pixel of the display device of FIG. 1.

Referring to FIG. 4, a pixel PX of the display device 1 may include a light-emitting element EMD, three transistors (DTR, STR1, and STR2), and a storage capacitor CST.

The light-emitting element EMD may emit light in accordance with a current supplied thereto via a driving transistor DTR. The light-emitting element EMD may be implemented as an OLED, a micro-LED, or a nano-LED, but the disclosure is not limited thereto.

The first electrode (i.e., the anode electrode) of the light-emitting element EMD may be electrically connected to the source electrode of the driving transistor DTR, and the second electrode (i.e., the cathode electrode) of the light-emitting element EMD may be electrically connected to a second power supply line ELVSL to which a low-potential voltage, i.e., a second power supply voltage, may be supplied. The second power supply voltage may be lower than a high-potential voltage applied to the first power supply line ELVDL, i.e., a first power supply voltage.

The driving transistor DTR may control a current that may flow from the first power supply line ELVDL to the light-emitting element EMD, in accordance with the difference in voltage between the gate and source electrodes of the driving transistor DTR. The gate electrode of the driving transistor DTR may be electrically connected to the second source/drain electrode of a first switching transistor STR1, the source electrode of the driving transistor DTR may be electrically connected to the first electrode of the light-emitting element EMD, and the drain electrode of the driving transistor DTR may be electrically connected to the first power supply line ELVDL to which the first power supply voltage may be applied.

The first switching transistor STR1 may be turned on by a scan signal from a scan line SCL to connect a data line DTL to the gate electrode of the driving transistor DTR. The gate electrode of the first switching transistor STR1 may be electrically connected to the scan line SCL, the first source/drain electrode of the first switching transistor STR1 may be electrically connected to the data line DTL, and the second source/drain electrode of the first switching transistor STR1 may be electrically connected to the gate electrode of the driving transistor DTR.

A second switching transistor STR2 may be turned on by a sensing signal from a sensing signal line SSL to connect a reference voltage line RVL to the source electrode of the driving transistor DTR. The gate electrode of the second switching transistor STR2 may be electrically connected to the sensing signal line SSL, the first source/drain electrode of the second switching transistor STR2 may be electrically connected to the reference voltage line RVL, and the second source/drain electrode of the second switching transistor STR2 may be electrically connected to the source electrode of the driving transistor DTR.

The first source/drain electrodes of the first and second switching transistors STR1 and STR2 may be source electrodes, and the second source/drain electrodes of the first and second switching transistors STR1 and STR2 may be drain electrodes. However, the disclosure is not limited to this. Alternatively, the first source/drain electrodes of the first and second switching transistors STR1 and STR2 may be drain electrodes, and the second source/drain electrodes of the first and second switching transistors STR1 and STR2 may be source electrodes.

The storage capacitor CST may be formed between the gate electrode and the source electrode of the driving transistor DTR. The storage capacitor CST may store the differential voltage between the gate and source voltages of the driving transistor DTR.

The driving transistor DTR and the first and second switching transistors STR1 and STR2 may be formed as thin-film transistors (TFTs). FIG. 3 illustrates that the driving transistor DTR and the first and second switching transistors STR1 and STR2 may be N-type metal oxide semiconductor field effect transistors (MOSFETs), but the disclosure is not limited thereto. Alternatively, the driving transistor DTR and the first and second switching transistors STR1 and STR2 may be formed as P-type MOSFETs. As an example, at least one of the driving transistor DTR and the first and second switching transistors STR1 and STR2 may be formed as an N-type MOSFET, and the other transistors may be formed as P-type MOSFETs.

Figure 5:
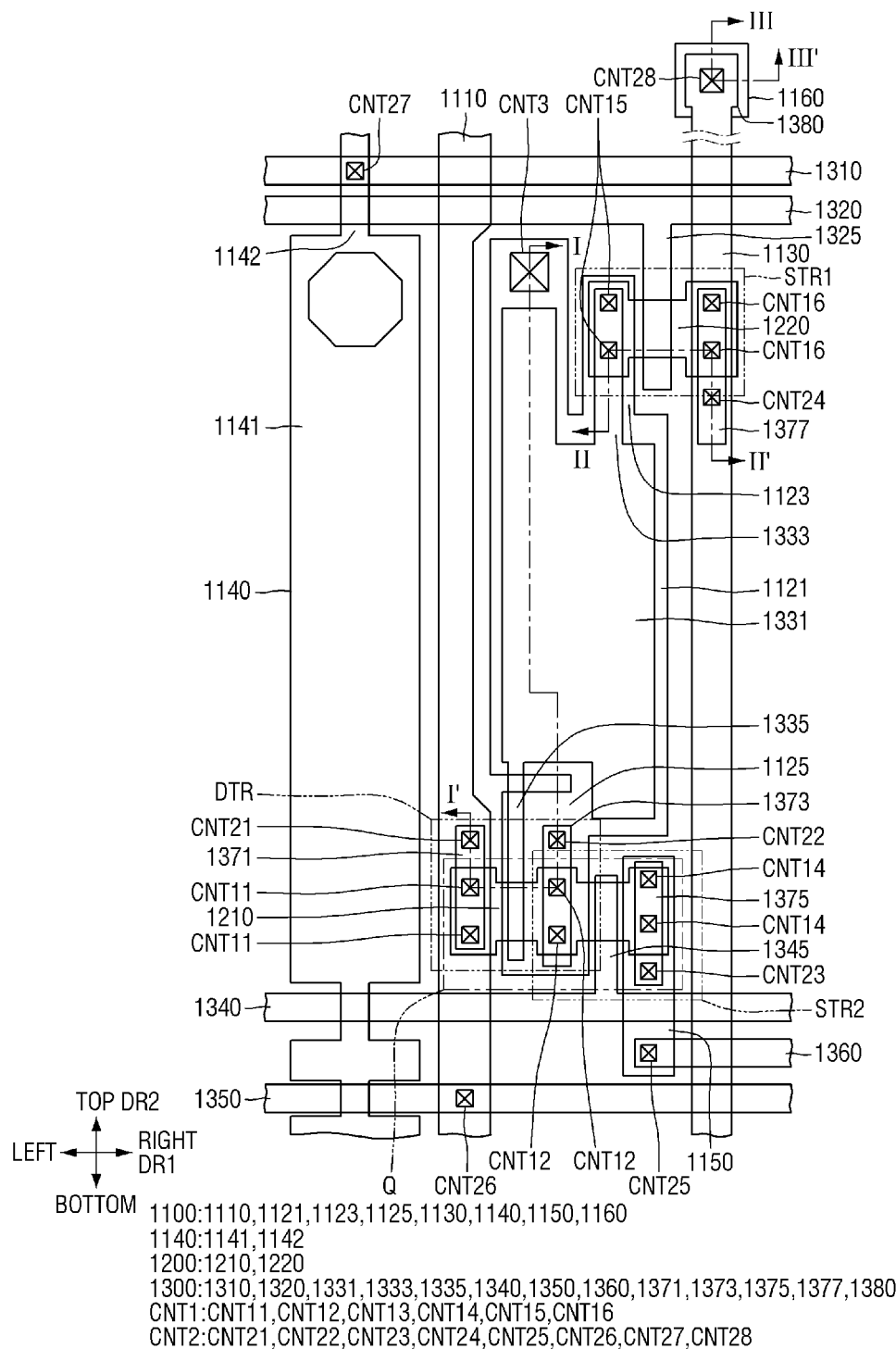
FIG. 5 is a layout view of a pixel of the display device of FIG. 1.
Figure 6:
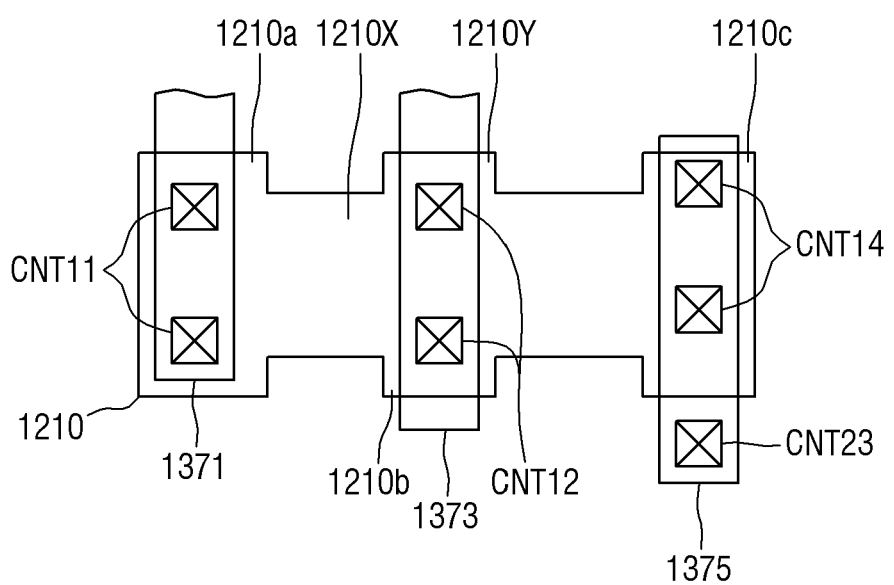
FIG. 6 is a cutout layout view of a part Q of FIG. 5.
Figure 7:
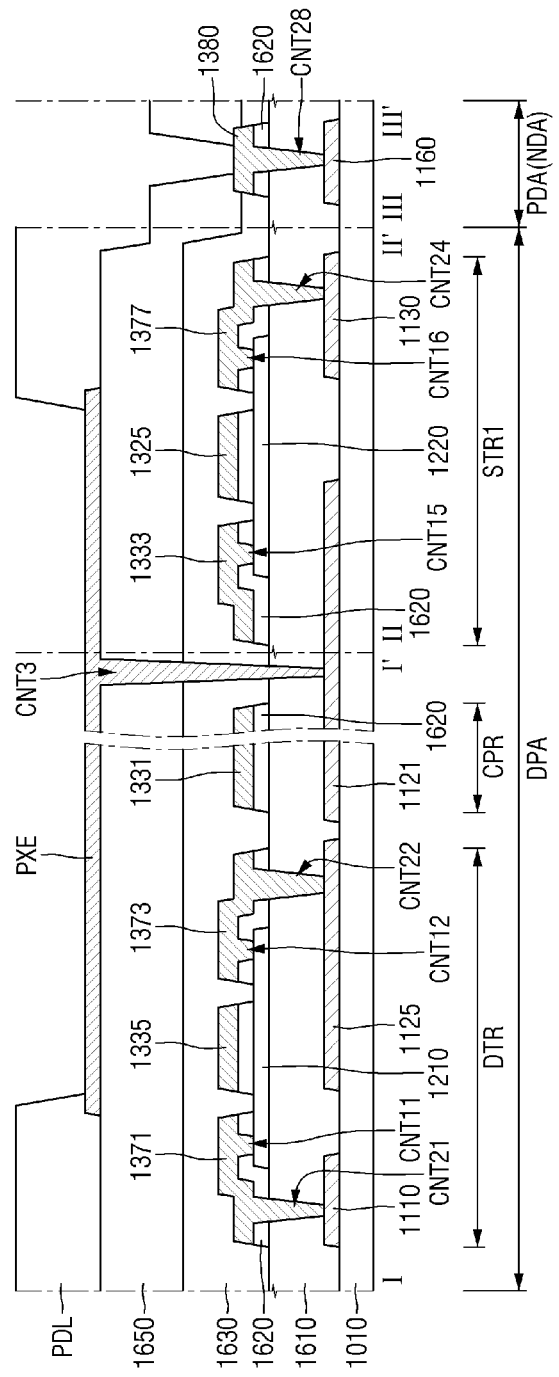
FIG. 7 illustrates schematic cross-sectional views taken along lines I-I', II-II', and III-III' of FIG. 5.

FIG. 5 is a layout view of a pixel of the display device of FIG. 1. FIG. 6 is a cutout layout view illustrating a part Q of FIG. 5. FIG. 7 illustrates schematic cross-sectional views taken along lines I-I', II-II', and of FIG. 5.

FIG. 7 illustrates schematic cross-sectional views, taken along lines I-I' and II-II' of FIG. 5, of part of the display area DPA and a schematic cross-sectional view, taken along line III-III' of FIG. 5, of part of the non-display area NDA. For example, FIG. 7 illustrates the display area DPA, as an example, a driving transistor region DTR where a driving transistor DTR may be disposed, a first switching transistor region STR1 where a first switching transistor STR1 may be disposed, and a capacitor region CPR where a storage capacitor CST may be disposed, and also illustrates the non-display area NDA, for example, a pad area PDA. For convenience, FIG. 7 mainly illustrates the circuit layer CCL of the first display substrate 10 that ranges from the first substrate 1010 to the pixel-defining film PDL.

Multiple layers located or disposed in one pixel PX of the display device 1 will hereinafter be described with reference to FIGS. 5 through 7.

Referring to FIGS. 5 and 7, a pixel PX may include transistors (DTR, STR1, and STR2) and a storage capacitor CST.

Each of the transistors (DTR, STR1, and STR2) may include conductive layers that may form electrodes, semiconductor patterns that may form a channel, and an insulating layer. The storage capacitor CST may include an insulating layer that may be located or disposed between the conductive layers that form the electrodes. For example, the storage capacitor CST may include a capacitor lower electrode, a capacitor upper electrode and an insulating layer located or disposed between the capacitor lower electrode and the capacitor upper electrode. The aforementioned conductive materials or layers, the semiconductor patterns, and the insulating layers may be located or disposed on the first substrate 1010.

The circuit layer CCL of the display device 1 may include a semiconductor layer 1200, conductive layers, and insulating layers. The conductive layers may include a first conductive layer 1100, a second conductive layer 1300, and a pixel electrode PXE. The insulating layers may include an interlayer insulating film 1610, a gate insulating film 1620, a passivation layer 1630, and a planarization film 1650. The first conductive layer 1110, the interlayer insulating film 1610, semiconductor patterns 1200, the gate insulating film 1620, the second conductive layer 1300, the passivation layer 1630, and the planarization film 1650 may be sequentially located or disposed on the first substrate 1010. The first conductive layer 1100 the interlayer insulating film 1610, semiconductor patterns 1200, the gate insulating film 1620, the second conductive layer 1300, the passivation layer 1630, and the planarization film 1650 may be formed as single-layer films or as multilayer films each including multiple films. There may be additionally provided layers located or disposed between first conductive layer 1110, the interlayer insulating film 1610, semiconductor patterns 1200, the gate insulating film 1620, the second conductive layer 1300, the passivation layer 1630, and the planarization film 1650.

The first conductive layer 1100 may be located or disposed on the first substrate 1010. In the display area DPA, the first conductive layer 1100 may include a first power supply wire 1110, which may correspond to the first power supply line ELVDL of FIG. 3, a capacitor lower electrode 1121, a capacitor lower electrode first extension 1123, a capacitor lower electrode second extension 1125, a data signal line 1130, which may correspond to the data line DTL of FIG. 3, a second power supply wire 1140, which may correspond to the second power supply line ELVSL of FIG. 3, and a reference voltage connecting electrode 1150. In the non-display area NDA, the first conductive layer 1100 may include a data pad 1160. The first conductive layer 1100 may include other lines, wires, and electrodes within the spirit and scope of the disclosure and is not limited to the above description or that which is illustrated in the drawings.

The first power supply wire 1110 may be located or disposed at the center of the pixel PX in a plan view. The first power supply wire 1110 may extend in the second direction DR2. The first power supply line 1110 may extend from the pixel PX to neighboring pixels PX in the second direction DR2.

The first power supply wire 1110 may pass through the driving transistor region DTR. The first power supply wire 1110 may be located or disposed to pass through at least part of the driving transistor region DTR and may overlap, in a thickness direction, with at least part of the first conductive region of a first semiconductor pattern 1210 and with at least part of a driving transistor first electrode 1371.

In a plan view, the data signal line 1130 may be located or disposed on the right side of the first power supply wire 1110 to be apart from the first power supply line 1110. In a plan view, the data signal line 1130 may be located or disposed on the right side of the pixel PX to extend in the second direction DR2. The data signal line 1130 may extend from the pixel PX to the neighboring pixels PX in the second direction DR2.

The data signal line 1130 may pass through the first switching transistor region STR1. The data signal line 1130 may be located or disposed to pass at least part of the first switching transistor region STR1 and may overlap, in the thickness direction, at least part of the first conductive region of a second semiconductor pattern 1220 and at least part of a first switching transistor first electrode 1377.

In a plan view, the second power supply wire 1140 may be located or disposed on the left side of the first power supply wire 1110 to be apart from the first power supply wire 1110. In a plan view, the second power supply wire 1140 may be located or disposed on the left side of the pixel PX to extend in the second direction DR2. The second power supply wire 1140 may extend from the pixel PX to the neighboring pixels PX in the second direction DR2.

The second power supply wire 1140 may include a wide part 1141 and a narrow part 1142. The width, in the first direction DR1, of the wide part 1141 may be greater than the width, in the first direction DR1, of the narrow part 1142. The second power supply wire 1140 may generally consist of the wide part 1141, but may include the narrow part 1142 in an area that may overlap the second conductive layer 1300 in the thickness direction. Since the second power supply wire 1140 consists of the narrow part 1142 in the area that may overlap the second conductive layer 1300 in the thickness direction, the interference or the resistance between the first and second conductive layers 1100 and 1300 may be reduced.

The capacitor lower electrode 1121 may extend across the center of the pixel PX and may be located or disposed between the first power supply wire 1110 and the data signal line 1130 in a plan view. For example, the capacitor lower electrode 1121 may be located or disposed on the right side of the first power supply wire 1110 and on the left side of the data signal line 1130 to be apart from the first power supply wire 1110 and the data signal line 1130. For example, the capacitor lower electrode 1121 may protrude from the upper left side of a rectangular shape in an upward direction (or in the second direction DR2) and may also protrude from the lower left side of the rectangular shape in a downward direction (or in the opposite direction of the second direction DR2), but the disclosure is not limited thereto.

The capacitor lower electrode 1121 may be located or disposed in the capacitor region CPR or the entire capacitor region CPR. The capacitor lower electrode 1121 may be located or disposed in the entire capacitor region CPR and may extend to the outside of the capacitor region CPR over the first substrate 1010. Part of the capacitor lower electrode 1121 on the outside of the capacitor region CPR may be electrically connected to the pixel electrode PXE through a contact hole CNT3.

The capacitor lower electrode first extension 1123 may be located or disposed to protrude from the upper right side of the capacitor lower electrode 1121 in the upward direction (or in the second direction DR2). The capacitor lower electrode first extension 1123 may be located or disposed between the data signal line 1130 and part of the capacitor lower electrode 1121 that protrudes from the upper left side of the capacitor lower electrode 1121 and may thus be spaced apart from the capacitor lower electrode 1121 and the data signal line 1130. The capacitor lower electrode first extension 1123 may have a substantially rectangular shape that may extend longer in the second direction DR2 than in the first direction DR1, but the disclosure is not limited thereto.

The capacitor lower electrode first extension 1123 may be located or disposed to pass through at least part of the first switching transistor region STR1 and may overlap, in the thickness direction, at least part of the first switching transistor second electrode 1333 and with at least part of the second conductive region of the second semiconductor pattern 1220.

The capacitor lower electrode second extension 1125 may be located or disposed to protrude from the lower left side of the capacitor lower electrode 1121 in the downward direction (or in the opposite direction of the second direction DR2). The capacitor lower electrode second extension 1125 may be located or disposed between the first power supply wire 1110 and the data signal line 1130 to be apart from the first power supply wire 1110 and the data signal line 1130. The capacitor lower electrode second extension 1125 may have a substantially rectangular shape that may extend longer in the second direction DR2 than in the first direction DR1, but the disclosure is not limited thereto.

The capacitor lower electrode second extension 1125 may be located or disposed to pass through at least part of the driving transistor region DTR and may overlap, in the thickness direction, at least part of the second conductive region of the first semiconductor pattern 1210 and with a driving transistor second electrode 1373.

The capacitor lower electrode 1121, the capacitor lower electrode first extension 1123, and the capacitor lower electrode second extension 1125 may be integrally formed as a single first conductive pattern.

The reference voltage connecting electrode 1150 may be located or disposed in the gaps between the capacitor lower electrode second extension 1125, the data signal line 1130, and the capacitor lower electrode 1121. For example, in a plan view, the reference voltage connecting electrode 1150 may be located or disposed on the right side of the capacitor lower electrode second extension 1125, on the left side of the data signal line 1130, and on the lower side of the capacitor lower electrode 1121. The reference voltage connecting electrode 1150 may be spaced apart from the capacitor lower electrode second extension 1125, the data signal line 1130, and the capacitor lower electrode 1121.

For example, the reference voltage connecting electrode 1150 may have a substantially rectangular shape that may extend longer in the second direction DR2 than in the first direction DR1. In this case, the reference voltage connecting electrode 1150 may extend beyond the capacitor lower electrode second extension 1125 in the opposite direction of the second direction DR2 so that the lower short side of the reference voltage connecting electrode 1150 may be located or disposed below the lower short side of the capacitor lower electrode second extension 1125.

The data pad 1160 may be located or disposed in the pad area PDA of the non-display area NDA. The data pad 1160 may have a substantially square shape that may extend by the same length in both the first and second directions DR1 and DR2. Since the data signal line 1130 may extend in the second direction DR2 to the pad area PDA of the non-display area NDA, the data pad 1160 may be provided at the end of the data signal line 1130.

The first conductive layer 1100 may include at least one metal selected from among Mo, Al, Pt, Pd, Ag, Mg, Au, Ni, Nd, Ir, Cr, Ca, titanium (Ti), tantalum (Ta), tungsten (W), and copper (Cu). The first conductive layer 1100 may be a single- or multi-layer film.

The interlayer insulating film 1610 may be located or disposed on the first conductive layer 1100. The interlayer insulating film 1610 may be located or disposed, in the display area DPA and the non-display area NDA, on the first conductive layer 1100 and on parts of the first substrate 1010 exposed by the first conductive layer 1100.

The interlayer insulating film 1610 may include contact holes CNT2 which may expose parts of the first conductive layer 1100. The top surface of the first conductive layer 1100 may be in contact with at least part of the second conductive layer 1300 through the contact holes CNT2 and with the pixel electrode PXE through the contact hole CNT3.

The interlayer insulating film 1610 may include an inorganic insulating material such as silicon oxide, silicon nitride, silicon oxynitride, hafnium oxide, aluminum oxide, titanium oxide, tantalum oxide, or zirconium oxide or an organic insulating material such as an acrylic resin, an epoxy resin, a phenolic resin, a polyamide resin, a polyimide resin, an unsaturated polyester resin, a polyphenylene ether resin, a polyphenylene sulfide resin, or BCB. For example, the interlayer insulating film 1610 may include SiON. The interlayer insulating film 1610 may be a single-layer film or a multilayer film including a stack of different materials.

The semiconductor layer 1200 may be located or disposed on the interlayer insulating film 1610. The semiconductor layer 1200 may include the first and second semiconductor patterns 1210 and 1220. The first semiconductor pattern 1210 may correspond to the active layers of the driving transistor DTR and a second switching transistor STR2, and the second semiconductor pattern 1220 may correspond to the active layer of the first switching transistor STR1.

The semiconductor layer 1200 may include an oxide semiconductor. The oxide semiconductor may include a binary compound (ABx), a ternary compound (ABxCy), or a quaternary compound (ABxCyDz) containing, for example, indium (In), zinc (Zn), gallium (Ga), tin (Sn), Ti (titanium), Al (aluminum), hafnium (Hf), zirconium (Zr), or Mg (magnesium). For example, the semiconductor layer 1200 may include indium tin zinc oxide (IGZO).

The first and second semiconductor patterns 1210 and 1220 may have a predetermined shape in a plan view. For example, each of the first and second semiconductor patterns 1210 and 1220 may generally extend in the first direction DR1, and both end parts of each of the first and second semiconductor patterns 1210 and 1220 may be expanded in the second direction DR2 to be wider than the rest of the corresponding semiconductor pattern.

The first semiconductor pattern 1210 may include an extension that may extend in the first direction DR1 and pairs of expanded parts that may extend in the second direction DR2 from both sides of the extension by the same or similar distance. Referring to FIG. 6, for example, the first semiconductor pattern 1210 may include an extension 1210X which may extend in the first direction DR1, a first conductive region 1210a, which may be located or disposed on a first side of the extension and includes expanded parts 1210Y that may extend in the second direction DR2, a third conductive region 1210c which may be located or disposed on a second side of the extension that may be opposite to the first side of the extension and includes expanded parts that extend in the second direction DR2, and a second conductive region 1210b which may be located or disposed between the first and second sides of the extension and includes expanded parts that extend in the second direction DR2. For example, the first and second sides of the extension may be the left and right sides, respectively, of the extension, but the disclosure is not limited thereto.

In a plan view, the first semiconductor pattern 1210 may be located or disposed on the lower side of the capacitor lower electrode 1121, which may be located or disposed at the center of the pixel PX. The first conductive region 1210*a* of the first semiconductor pattern 1210 may be located or disposed on the first power supply wire 1110 in the second direction DR2 to overlap the first power supply wire 1110 in the thickness direction, the second conductive region 1210*b* of the first semiconductor pattern 1210 may be located or disposed on the capacitor lower electrode second extension 1125 in the second direction DR2 to overlap the capacitor lower electrode second extension 1125 in the thickness direction, and the third conductive region 1210*c* of the first semiconductor pattern 1210 may be located or disposed on the reference voltage connecting electrode 1150 in the second direction DR2 to overlap the reference voltage connecting electrode 1150.

The first and second conductive regions 1210*a* and 1210*b* of the first semiconductor pattern 1210 and part of the extension of the first semiconductor pattern 1210 that may connect the first and second conductive regions 1210*a* and 1210*b* may correspond to the active layer of the driving transistor DTR. The first conductive region 1210*a* may correspond to the first source/drain region of the driving transistor DTR, and the part of the extension of the first semiconductor pattern 1210 that may connect the first and second conductive regions 1210*a* and 1210*b* may be the channel region of the driving transistor DTR.

The second and third conductive regions 1210*b* and 1210*c* of the first semiconductor pattern 1210 and part of the extension of the first semiconductor pattern 1210 that may connect the second and third conductive regions 1210*b* and 1210*c* may correspond to the active layer of the second switching transistor STR2. The third conductive region 1210*c* may be the first source/drain region of the second switching transistor STR2, and the part of the extension of the first semiconductor pattern 1210 that may connect the second and third conductive regions 1210*b* and 1210*c* may be the channel region of the second switching transistor STR2.

The second conductive region 1210*b* of the first semiconductor pattern 1210 may be the second source/drain region of the driving transistor DTR and the second source/drain region of the second switching transistor STR2.

In a plan view, the second semiconductor pattern 1220 may be located or disposed on the upper side of the center of the pixel PX. In a plan view, the second semiconductor pattern 1220 may include an extension which may extend in the first direction DR1, a second conductive region which may be located or disposed on a first side of the extension and may extend in the second direction DR2, and a first conductive region which may be located or disposed on a second side of the extension and extends in the second direction DR2. For example, the first and second sides of the extension of the second semiconductor pattern 1220 may be the left and right sides, respectively, of the extension of the second semiconductor pattern 1220, but the disclosure is not limited thereto.

The second conductive region of the second semiconductor pattern 1220 may be located or disposed on the capacitor lower electrode first extension 1123 to overlap the capacitor lower electrode first extension 1123, and the first conductive region of the second semiconductor pattern 1220 may be located or disposed on the data signal line 1130 in the second direction DR2 to overlap the data signal line 1130.

The first and second conductive regions of the second semiconductor pattern 1220 and the extension of the second semiconductor pattern 1220 that may connect the first and second conductive regions of the second semiconductor pattern 1220 may correspond to the active layer of the first switching transistor STR1. The second conductive region of the second semiconductor pattern 1220 may be the second source/drain region of the first switching transistor STR1, the first conductive region of the second semiconductor pattern 1220 may be the first source/drain region of the first switching transistor STR1, and the extension of the second semiconductor pattern 1220 may be the channel region of the first switching transistor STR1.

The gate insulating film 1620 may be located or disposed on the semiconductor layer 1200. The gate insulating film 1620 may be located or disposed in the display area DPA and the non-display area NDA. In the gate insulating film 1620, contact holes CNT1 which may expose parts of the semiconductor layer 1200 and contact holes CNT2 which may expose parts of the first conductive layer 1100 may be formed to penetrate the gate insulating film 1620.

The gate insulating film 1620 may include a silicon compound, a metal oxide, or the like, within the spirit and the scope of the disclosure. For example, the gate insulating film 1620 may include silicon oxide, silicon nitride, silicon oxynitride, aluminum oxide, tantalum oxide, hafnium oxide, zirconium oxide, or titanium oxide, and these materials may be used alone or in combination. The gate insulating film 1620 may be a single-layer film or a multilayer film having a stack of different materials.

The gate insulating film 1620 may be formed similar to the second conductive layer 1300. Thus, the sides of the gate insulating film 1620 may be generally aligned with the sides of the second conductive layer 1300, which may be located or disposed on the gate insulating film 1620, but the disclosure is not limited thereto. The gate insulating film 1620 may be located or disposed to be patterned on parts of the semiconductor layer 1200 and on parts of the interlayer insulating film 1610, but the disclosure is not limited thereto. Alternatively, the gate insulating film 1620 may include contact holes (CNT1 and CNT2) and may be located or disposed on the semiconductor layer 1200 and on parts of the interlayer insulating film 1610 that may be exposed by the semiconductor layer 1200.

The second conductive layer 1300 may be located or disposed on the gate insulating film 1620. In the display area DPA, the second conductive layer 1300 may include a second power supply auxiliary wire 1310, a scan signal line 1320, which may correspond to the scan line SCL of FIG. 3, a first switching transistor gate electrode 1325, a capacitor upper electrode 1331, a first switching transistor second electrode 1333, a driving transistor gate electrode 1335, a sensing signal line 1340, which may correspond to the sensing signal line SSL of FIG. 4, a first power supply auxiliary wire 1350, a reference voltage wire 1360, which may correspond to the reference voltage line RVL of FIG. 4, a driving transistor first electrode 1371, a transistor shared electrode 1373, a second switching transistor first electrode 1375. In the non-display area NDA, the second conductive layer 1300 may include a pad electrode 1380. The second conductive layer 1300 may include other lines, wires, and electrodes within the spirit and scope of the disclosure and is not limited to the above description or that which is illustrated in the drawings.

The second conductive layer 1300 may be formed of a low-resistance material. The second conductive layer 1300 may include a material such as Cu, Ti, Mo, Al, or Ag, but the disclosure is not limited thereto. The first conductive layer 1100 may be a single- or multi-layer film. For example, the second conductive layer 1300 may be a double-layer film of Ti/Cu, and the second conductive layer 1300 may have a stack of Ti/Cu.

In a plan view, the second power supply auxiliary wire 1310 may be located or disposed on the upper side of the pixel PX. The second power supply auxiliary wire 1310 may extend in the first direction DR1. The second power supply auxiliary wire 1310 may extend from the pixel PX to neighboring pixels PX in the first direction DR1.

The second power supply auxiliary wire 1310 may be located or disposed to intersect the narrow part 1142 of the second power supply wire 1140, the first power supply wire 1110, and the data signal line 1130, which may be located or disposed below the second power supply auxiliary wire 1310. Accordingly, in a plan view, the second power supply auxiliary wire 1310 may overlap parts of the second power supply wire 1140, the first power supply wire 1110, and the data signal line 1130, on the upper side of the pixel PX.

A contact hole CNT27 may be formed at the intersection between the second power supply auxiliary wire 1310 and the second power supply wire 1140. The second power supply auxiliary wire 1310 may be electrically connected to the second power supply wire 1140 through the contact hole CNT27. Although not illustrated in FIG. 7, the second power supply auxiliary wire 1310 may be in contact with part of the top surface of the second power supply wire 1140 through the contact hole CNT27. Since the second power supply auxiliary wire 1310 may be electrically connected to the second power supply wire 1140, a second power supply voltage may be evenly delivered to multiple pixels PX without being affected by any voltage drop.

In a plan view, the scan signal line 1320 may be located or disposed on the lower side of the second power supply auxiliary wire 1310 to be apart from the second power supply auxiliary wire 1310. The scan signal line 1320 may extend in the first direction DR1. The scan signal line 1320 may extend from the pixel PX to the neighboring pixels PX in the first direction DR1.

The scan signal line 1320 may be located or disposed to intersect the narrow part 1142 of the second power supply wire 1140, the first power supply wire 1110, and the data signal line 1130, which may be located or disposed below the second conductive layer 1300. Accordingly, in a plan view, the scan signal line 1320 may overlap parts of the second power supply wire 1140, the first power supply wire 1110, and the data signal line 1130, on the upper side of the pixel PX.

The first switching transistor gate electrode 1325 may branch off from the scan signal line 1320 and may extend in the downward direction (i.e., in the opposite direction of the second direction DR2). At least part of the first switching transistor gate electrode 1325 may be located or disposed to overlap the extension of the second semiconductor pattern 1220 that may connect, in the first direction DR1, the first and second conductive regions of the second semiconductor pattern 1220. The channel region of the first switching transistor STR1 may be an area of the second semiconductor pattern 1220 where the first switching transistor gate electrode 1325 and the second semiconductor pattern 1220 may overlap.

The capacitor upper electrode 1331 may be located or disposed on the capacitor lower electrode 1121 to overlap at least part of the capacitor lower electrode 1121. The shape of the capacitor upper electrode 1331 may be substantially similar to the shape of the capacitor lower electrode 1121. The capacitor upper electrode 1331 may be formed to have a smaller area than the capacitor lower electrode 1121 and thus to expose an upper left part of the capacitor lower electrode 1121.

The capacitor upper electrode 1331 may be located or disposed to overlap the capacitor lower electrode 1121 with the interlayer insulating film 1610 and the gate insulating layer 1620 interposed therebetween and thus to form the storage capacitor CST. The interlayer insulating film 1610 and the gate insulating layer 1620, which may be interposed between the capacitor lower electrode 1121 and the capacitor upper electrode 1331, may serve as the dielectrics of the storage capacitor CST.

The first switching transistor second electrode 1333 may be formed to protrude from the upper right side of the capacitor upper electrode 1331. The first switching transistor second electrode 1333 may branch off from the capacitor upper electrode 1331 in the second direction DR2 and may be located or disposed to overlap the second conductive region of the second semiconductor pattern 1220. The first switching transistor second electrode 1333 may be electrically connected to the second conductive region of the second semiconductor pattern 1220 through a contact hole CNT15. The first switching transistor second electrode 1333 may be the second source/drain electrode of the first switching transistor STR1.

The driving transistor gate electrode 1335 may be formed to protrude from the lower left side of the capacitor upper electrode 1331. The driving transistor gate electrode 1335 may branch off from the capacitor upper electrode 1331 in the opposite direction of the second direction DR2 and may be located or disposed to overlap the part of the extension of the first semiconductor pattern 1210 that may connect the first and second conductive regions 1210*a* and 1210*b* of the first semiconductor pattern 1210. An area of the first semiconductor pattern 1220 where the driving transistor gate electrode 1335 and the first semiconductor pattern 1210 may overlap may be the channel region of the driving transistor DTR. The driving transistor gate electrode 1335 may be the gate electrode of the driving transistor DTR.

The capacitor upper electrode 1331, the first switching transistor second electrode 1333, and the driving transistor gate electrode 1335 may be integrally formed as a single second conductive pattern.

In a plan view, the sensing signal line 1340 may be located or disposed on the lower side of the first semiconductor pattern 1210 to be apart from the first semiconductor pattern 1210. The sensing signal line 1340 may extend in the first direction DR1. The sensing signal line 1340 may extend from the pixel PX to the neighboring pixels PX in the first direction DR1.

The sensing signal line 1340 may be located or disposed to intersect the narrow part 1142 of the second power supply wire 1140, the first power supply wire 1110, the data signal line 1130, and the reference voltage connecting electrode 1150, which may be located or disposed below the sensing signal line 1340. Accordingly, in a plan view, the sensing signal line 1340 may overlap parts of the second power supply wire 1140, the first power supply wire 1110, the data signal line 1130, and the reference voltage connecting electrode 1150, on the lower side of the pixel PX.

The second switching transistor gate electrode 1345 may branch off from the sensing signal line 1340 and may extend in the upward direction (i.e., in the second direction DR2). At least part of the second switching transistor gate electrode 1345 may be located or disposed to overlap the extension of the first semiconductor pattern 1210 that may connect, in the first direction DR1, the second and third conductive regions 1210b and 1210c of the first semiconductor pattern 1210. The channel region of the second switching transistor STR2 may be an area of the first semiconductor pattern 1210 where the second switching transistor gate electrode 1345 and the first semiconductor pattern 1210 may overlap. The second switching transistor gate electrode 1345 may be the gate electrode of the second switching transistor STR2.

In a plan view, the first power supply auxiliary wire 1350 may be located or disposed on the lower side of the sensing signal line 1340 to be apart from the sensing signal line 1340. In a plan view, the first power supply auxiliary wire 1350 may be located or disposed on the lower side of the pixel PX. The first power supply auxiliary wire 1350 may extend in the first direction DR1. The first power supply auxiliary wire 1350 may extend from the pixel PX to the neighboring pixels PX in the first direction DR1.

The first power supply auxiliary wire 1350 may be located or disposed to intersect the narrow part 1142 of the second power supply wire 1140, the first power supply wire 1110, and the data signal line 1130, which may be located or disposed below the first power supply auxiliary wire 1350. The first power supply auxiliary wire 1350 may overlap parts of the second power supply wire 1140, the first power supply wire 1110, and the data signal line 1130, on the lower side of the pixel PX in a plan view.

A contact hole CNT26 may be formed at the intersection between the first power supply auxiliary wire 1350 and the first power supply wire 1110. The first power supply auxiliary wire 1350 may be electrically connected to the first power supply wire 1110 through the contact hole CNT26. Although not illustrated in FIG. 7, the first power supply auxiliary wire 1350 may be in contact with part of the top surface of the first power supply wire 1110 through the contact hole CNT26. Since the first power supply auxiliary wire 1350 may be electrically connected to the first power supply wire 1110, a first power supply voltage may be evenly delivered to multiple pixels PX without being affected by any voltage drop.

The reference voltage wire 1360 may be located or disposed between the sensing signal line 1340 and the first power supply auxiliary wire 1350. The reference voltage wire 1360 may be formed to be apart from the sensing signal line 1340 and the first power supply auxiliary wire 1350 and to extend in the first direction DR1.

The reference voltage wire 1360 may be located or disposed to overlap the reference voltage connecting electrode 1150 and the data signal line 1130. One end of the reference voltage wire 1360 is illustrated as extending to a neighboring pixel PX to the left of the pixel PX, but the disclosure is not limited thereto. A contact hole CNT25 may be formed in the overlapping area of the reference voltage wire 1360 and the reference voltage connecting electrode 1150. The reference voltage wire 1360 may be electrically connected to the reference voltage connecting electrode 1150 through the contact hole CNT25. Although not illustrated in FIG. 7, the reference voltage wire 1360 may be in contact with part of the top surface of the reference voltage connecting electrode 1150 through the contact hole CNT25.

The reference voltage wire 1360 may transmit a reference voltage to the second switching transistor first electrode 1375 through the contact hole CNT25, the reference voltage connecting electrode 1150, and a contact hole CNT14.

The driving transistor first electrode 1371 may be located or disposed above the first conductive region 1210a of the first semiconductor pattern 1210 to overlap the first conductive region 1210a of the first semiconductor pattern 1210 and the first power supply wire 1110. The driving transistor first electrode 1371 may extend in the second direction DR2, and the length, in the first direction DR1, of the driving transistor first electrode 1371 may be smaller than the length, in the second direction DR2, of the driving transistor first electrode 1371. The driving transistor first electrode 1371 may extend upwardly from the overlapping area with the first conductive region 1210a of the first semiconductor pattern 1210 and may thus overlap part of the first power supply wire 1110 that does not overlap the first conductive region 1210a of the first semiconductor pattern 1210.

In the overlapping area with the part of the first power supply wire 1110 that may not overlap the first conductive region 1210a of the first semiconductor pattern 1210, the driving transistor first electrode 1371 may be in contact with, and electrically connected to the first power supply wire 1110 through a contact hole CNT21 that may penetrate the interlayer insulating film 1610 and the gate insulating film 1620 to expose part of the first power supply wire 1110. In a plan view, the contact hole CNT21 may be located or disposed on the upper side of the driving transistor first electrode 1371, but the disclosure is not limited thereto.

The driving transistor first electrode 1371 may also be in contact with, and electrically connected, to the first conductive region 1210a of the first semiconductor pattern 1210 through a contact hole CNT11 that may penetrate the gate insulating film 1620 to expose the first conductive region 1210a of the first semiconductor pattern 1210. The contact hole CNT11 may be located or disposed on the lower side of the contact hole CNT21 in a plan view, but the disclosure is not limited thereto. The driving transistor first electrode 1371, which may be located or disposed above the first conductive region 1210a of the first semiconductor pattern 1210, may be provided in the first source/drain region of the driving transistor DTR and may be the first source/drain electrode of the driving transistor DTR. For example, the first source/drain electrode of the driving transistor DTR may be the drain electrode of the driving transistor DTR.

The transistor shared electrode 1373 may be located or disposed above the second conductive region 1210b of the first semiconductor pattern 1210 to overlap the second conductive region 1210b of the first semiconductor pattern 1210 and the capacitor lower electrode second extension 1125. The transistor shared electrode 1373 may extend in the second direction DR2, and the length, in the first direction DR1, of the transistor shared electrode 1373 may be smaller than the length, in the second direction DR2, of the transistor shared electrode 1373. The transistor shared electrode 1373 may extend upwardly from the overlapping area with the second conductive region 1210b of the first semiconductor pattern 1210 and may thus overlap part of the capacitor lower electrode second extension 1125 that may not overlap the second conductive region 1210b of the first semiconductor pattern 1210.

In the overlapping area with the part of the capacitor lower electrode second extension 1125 that does not overlap the second conductive region 1210b of the first semiconductor pattern 1210, the transistor shared electrode 1373 may be in contact with, and electrically connected to the capacitor lower electrode second extension 1125 through a contact hole CNT22 that may penetrate the interlayer insulating film 1610 and the gate insulating film 1620 to expose part of the capacitor lower electrode second extension 1125. In a plan view, the contact hole CNT22 may be located or disposed on the upper side of the transistor shared electrode 1373, but the disclosure is not limited thereto.

The transistor shared electrode 1373 may also be in contact with, and electrically connected, to the second conductive region 1210b of the first semiconductor pattern 1210 through a contact hole CNT12 that may penetrate the gate insulating film 1620 to expose the second conductive region 1210b of the first semiconductor pattern 1210. The contact hole CNT12 may be located or disposed on the lower side of the contact hole CNT22 in a plan view, but the disclosure is not limited thereto.

The transistor shared electrode 1373, which may be located or disposed above the second conductive region 1210b of the first semiconductor pattern 1210, may be provided in the overlapping area of the driving transistor region DRT and the second switching transistor region STR2. The transistor shared electrode 1373 may be located or disposed in the second source/drain region of the driving transistor DTR and may be the second source/drain electrode of the driving transistor DTR. For example, the transistor shared electrode 1373 may be located or disposed in the second source/drain region of the second switching transistor STR2 and may be the second electrode of the second switching transistor STR2. For example, the second source/drain electrode of the driving transistor DTR may be the source electrode of the driving transistor DTR, and the second electrode of the second switching transistor STR2 may be the second source/drain electrode of the second switching transistor STR2.

The second switching transistor first electrode 1375 may be located or disposed on the third conductive region 1210c of the first semiconductor pattern 1210 to overlap the third conductive region 1210c of the first semiconductor pattern 1210 and the reference voltage connecting electrode 1150. The second switching transistor first electrode 1375 may extend in the second direction DR2, and the length, in the first direction DR1, of the second switching transistor first electrode 1375 may be smaller than the length, in the second direction DR2, of the second switching transistor first electrode 1375. The second switching transistor first electrode 1375 may extend downwardly from the overlapping area with the third conductive region 1210c of the first semiconductor pattern 1210 and may thus overlap part of the reference voltage connecting electrode 1150 that may not overlap the third conductive region 1210c of the first semiconductor pattern 1210.

In the overlapping area with the part of the reference voltage connecting electrode 1150 that may not overlap the third conductive region 1210c of the first semiconductor pattern 1210, the second switching transistor first electrode 1375 may be in contact with, and electrically connected to the reference voltage connecting electrode 1150 through a contact hole CNT23 that may penetrate the interlayer insulating film 1610 and the gate insulating film 1620 to expose part of the reference voltage connecting electrode 1150. The contact hole CNT23 may be located or disposed on the lower side of the second switching transistor first electrode 1375 in a plan view, but the disclosure is not limited thereto.

The second switching transistor first electrode 1375 may also be in contact with, and electrically connected, to the third conductive region 1210c of the first semiconductor pattern 1210 through a contact hole CNT14 that may penetrate the gate insulating film 1620 to expose the third conductive region 1210c of the first semiconductor pattern 1210. In a plan view, the contact hole CNT14 may be located or disposed on the upper side of the contact hole CNT23, but the disclosure is not limited thereto. The second switching transistor first electrode 1375, which may be located or disposed above the third conductive region 1210c of the first semiconductor pattern 1210, may be provided in the first source/drain region of the second switching transistor STR2 and may be the first electrode of the second switching transistor STR2. The first electrode of the second switching transistor STR2 may be the first source/drain electrode of the second switching transistor STR2.

The first switching transistor first electrode 1377 may be located or disposed on the first conductive region of the second semiconductor pattern 1220 to overlap the second semiconductor pattern 1220 and the data signal line 1130. The first switching transistor first electrode 1377 may extend in the second direction DR2, and the length, in the first direction DR1, of the first switching transistor first electrode 1377 may be smaller than the length, in the second direction DR2, of the first switching transistor first electrode 1377. The first switching transistor first electrode 1377 may extend downwardly from the overlapping area with the first conductive region of the second semiconductor pattern 1220 and may thus overlap part of the data signal line 1130 that may not overlap the first conductive region of the second semiconductor pattern 1220.

In the overlapping area with the part of data signal line 1130 that may not overlap the first conductive region of the second semiconductor pattern 1220, the first switching transistor first electrode 1377 may be in contact with, and electrically connected to the data signal line 1130 through a contact hole CNT24 that may penetrate the interlayer insulating film 1610 and the gate insulating film 1620 to expose part of the data signal line 1130. The contact hole CNT24 may be located or disposed on the lower side of the first switching transistor first electrode 1377 in a plan view, but the disclosure is not limited thereto.

The first switching transistor first electrode 1377 may also be in contact with, and electrically connected, to the first conductive region of the second semiconductor pattern 1220 through a contact hole CNT16 that may penetrate the gate insulating film 1620 to expose the first conductive region of the second semiconductor pattern 1220. In a plan view, the contact hole CNT16 may be located or disposed on the upper side of the contact hole CNT24, but the disclosure is not limited thereto. The first switching transistor first electrode 1377, which may be located or disposed above the first conductive region of the second semiconductor pattern 1220, may be provided in the first source/drain region of the first switching transistor STR1 and may be the first electrode of the first switching transistor STR1. The first electrode of the first switching transistor STR1 may be the first source/drain electrode of the first switching transistor STR1.

The pad electrode 1380 may be located or disposed on the data pad 1160. The pad electrode 1380 may be in contact with the top surface of the data pad 1160 through a contact hole CNT28. The pad electrode 1380 may be electrically connected to the data pad 1160 through the contact hole CNT28. The pad electrode 1380 may be used as the contact electrode of a wire pad WPD in the pad area PDA.

The passivation layer 1630 may be located or disposed on the second conductive layer 1300. The passivation layer 1630 may cover and protect the second conductive layer 1300. The passivation layer 1630 may include an inorganic insulating material such as silicon oxide, silicon nitride, silicon oxynitride, hafnium oxide, aluminum oxide, titanium oxide, tantalum oxide, or zirconium oxide. The passivation layer 1630 may be formed in the display area DPA and may not be formed in at least part of the non-display area NDA. The passivation layer 1630 may not be formed at least on the pad electrode 1380, which may be located or disposed in the pad area PDA, and may not overlap the pad electrode 1380.

The via layer 1650 may be located or disposed on the passivation layer 1630. The via layer 1650 may cover a side of the passivation layer 1630 adjacent to the pad area PDA. In the pad area PDA, the via layer 1650 may be located or disposed directly on the passivation layer 1630.

The via layer 1650 may include an organic insulating material such as an acrylic resin, an epoxy resin, a phenolic resin, a polyamide resin, a polyimide resin, an unsaturated polyester resin, a polyphenylene ether resin, a polyphenylene sulfide resin, or BCB. The via layer 1650 may include a photosensitive material, but the disclosure is not limited thereto. For example, the via layer 1650 may include polyimide.

The via layer 1650 may have different heights in different regions. For example, the via layer 1650 may have a stepped structure, shape, or height having different heights in different regions. The via layer 1650 may include a first region which has a first height and a second region which has a second height that may be smaller than the first height. The height of the via layer 1650 may be measured from a reference surface such as the first surface of the first substrate 1010. The via layer 1650 may be generally flat in each of the first and second regions, regardless of the shape or the presence of patterns therebelow. The via layer 1650 may have a stepped structure at the boundary between the first and second regions.

The first region of the via layer 1650 may be located or disposed in the display area DPA, and the second region of the via layer 1650 may be located or disposed in the pad area PDA of the non-display area NDA. At least part of the first region of the via layer 1650 may overlap the pixel electrode PXE, and another part of the first region of the via layer 1650 may be located or disposed in the non-emission areas NEM of the display area DPA and may not overlap the pixel electrode PXE. Since the via layer 1650 may have a small height in the second region thereof, for example, in the pad area PDA, an external device may be properly mounted on the pad electrode 1380.

The via layer 1650 may form a pad opening, which may expose the pad electrode 1380 in the pad area PDA, together with the passivation layer 1630. Parts of the via layer 1650 that may form the sidewalls of the pad opening may be located or disposed to overlap the pad electrode 1380.

The pixel electrode PXE may be located or disposed on the via layer 1650. The material of the pixel electrode PXE is as already described above with reference to FIG. 2. For example, the pixel electrode PXE may include a triple-layer film of ITO/Ag/ITO.

The pixel electrode PXE may be located or disposed in the display area DPA, but not in the non-display area NDA. The pixel electrode PXE may overlap the display area DPA, for example, the regions where the transistors (DTR, STR1, and STR2) may be located or disposed and the capacitor region CPR, but the disclosure is not limited thereto. The pixel electrode PXE may be in contact with, and electrically connected to the capacitor lower electrode 1121 of the first conductive layer 1100 through the contact hole CNT3, which may penetrate the via layer 1650, the passivation layer 1630, and the interlayer insulating film 1610.

The pixel-defining film PDL may be located or disposed on the pixel electrode PXE. The material of the pixel-defining film PDL is as already described above with reference to FIG. 2. For example, the pixel-defining film PDL may include polyimide.

The pixel-defining film PDL may be located or disposed in the display area DPA, but not in the non-display area NDA. The pixel-defining film PDL may be located or disposed to overlap the edges of the pixel electrode PXE. The pixel-defining film PDL may be located or disposed on parts of the via layer 1650 where the pixel electrode PXE may not be formed.

A method of manufacturing the display device 1 will hereinafter be described.

FIGS. 8 through 14 are schematic cross-sectional views illustrating a method of manufacturing the display device of FIG. 7.

Figure 8:
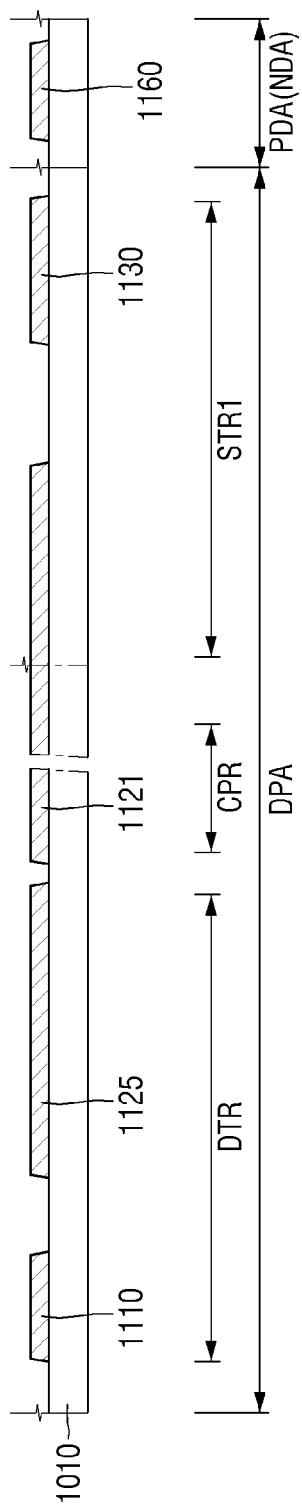
FIGS. 8 through 14 are schematic cross-sectional views illustrating a method of manufacturing the display device of FIG. 7.

Referring to FIG. 8, the first conductive layer 1100 may be formed on the first substrate 1010. The first conductive layer 1100, which may be patterned, may be formed by a mask process. For example, the first power supply wire 1110, the capacitor lower electrode 1121, the capacitor lower electrode second extension 1125, the data signal line 1130, and a pad light-shielding layer 1160 may be formed by the same mask process. For example, a material layer for forming the first conductive layer 1100 may be deposited on the entire surface of the first substrate 1010. Thereafter, a photoresist pattern may be formed by applying a photoresist layer on the material layer for forming the first conductive layer 1100 and subjecting the photoresist layer to exposure and development, and the material layer for forming the first conductive layer 1100 may be etched using the photoresist pattern as an etching mask. Thereafter, the photoresist pattern may be removed by a strip or ashing process. Since the first power supply wire 1110, the capacitor lower electrode 1121, the capacitor lower electrode second extension 1125, the data signal line 1130, and the data pad 1160 of the lower conductive layer 1100 may be patterned and formed at the same time, the number of masks may be maintained, and as a result, process economics may be guaranteed. Manufacturing costs may thus be reduced, and manufacturing efficiency may thus be improved.

Figure 9:
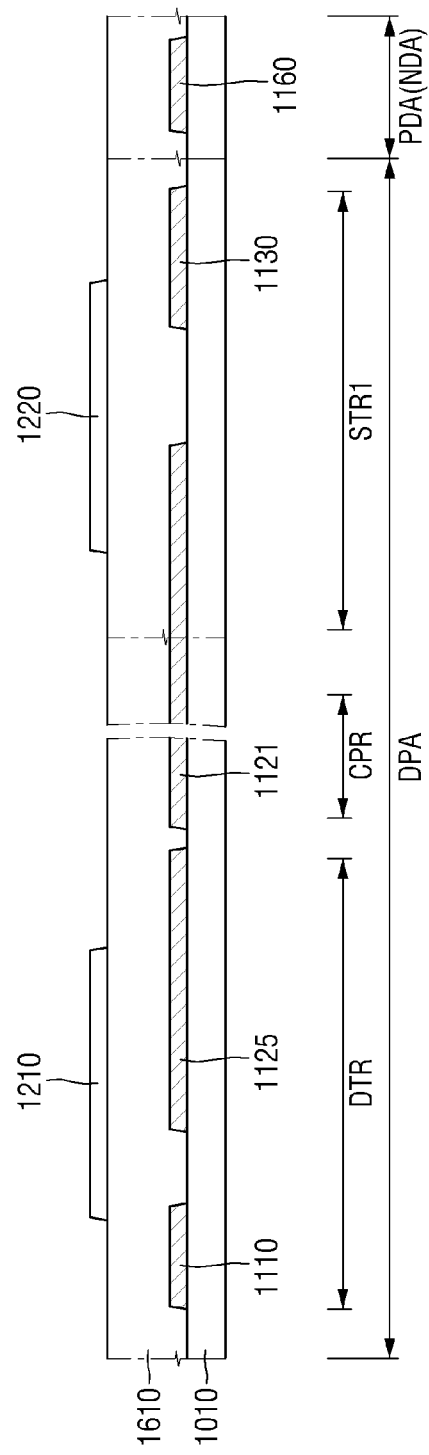

Thereafter, referring to FIG. 9, the interlayer insulating film 1610 may be formed on the entire surface of the first substrate 1010 with the first conductive layer 1100 formed thereon. Thereafter, the semiconductor layer 1200 may be formed on the interlayer insulating film 1610. The semiconductor layer 1200 may be formed by a mask process. For example, the first and second semiconductor patterns 1210 and 1220 may be formed, as illustrated in FIG. 9, by depositing an oxide semiconductor on the entire surface of the interlayer insulating film 1610 and patterning the oxide semiconductor via photolithography.

Figure 10:
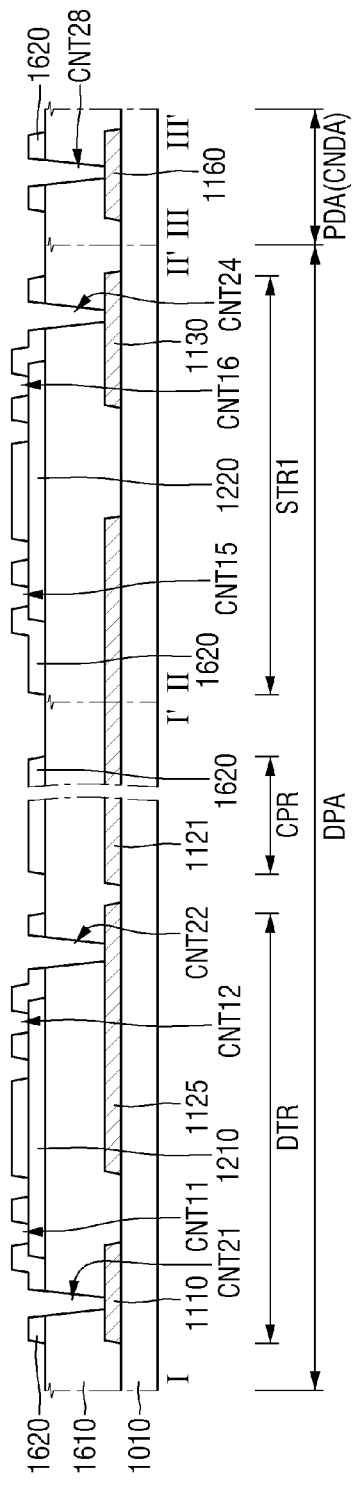

Thereafter, referring to FIG. 10, the gate insulating film 1620 may be deposited on the interlayer insulating film 1610 with the semiconductor layer 1200 formed thereon, and contact holes may be formed. The contact holes may include contact holes (CNT21, CNT22, CNT24, and CNT28), which may be patterned to expose parts of the first conductive layer 1100, and contact holes (CNT11, CNT12, CNT15, and CNT16), which may be patterned to expose parts of the semiconductor layer 1200. The contact holes may be formed by the same mask process. For example, a material layer for forming the gate insulating film 1620 may be deposited on the interlayer insulating film 1610 with the semiconductor layer 1200 formed thereon. Thereafter, a photoresist pattern (or contact hole patterns), which may expose the first conductive layer 1100 and parts of the semiconductor layer 1200, may be formed on the material layer for forming the gate insulating film 1620, and the contact holes (CNT21, CNT22, CNT24, and CNT28), which may expose the first conductive layer 1100, and the contact holes (CNT11, CNT12, CNT15, and CNT16), which may expose parts of the semiconductor layer 1200, may be formed using the photoresist pattern as an etching mask.

The contact holes (CNT21, CNT22, CNT24, and CNT28), which may expose the first conductive layer 1100, and the contact holes (CNT11, CNT12, CNT15, and CNT16), which may expose parts of the semiconductor layer 1200, may be sequentially formed using different masks. In this case, damage to the surface of the semiconductor 1200 may be suppressed because the semiconductor layer 1200 may not be exposed to an etchant when the interlayer insulating film 1610 is being etched to form the contact holes (CNT21, CNT22, CNT24, and CNT28), which expose the first conductive layer 1100. However, due to the addition of a mask process, the economic efficiency of the manufacture of the display device 1 may decrease.

Figure 11:
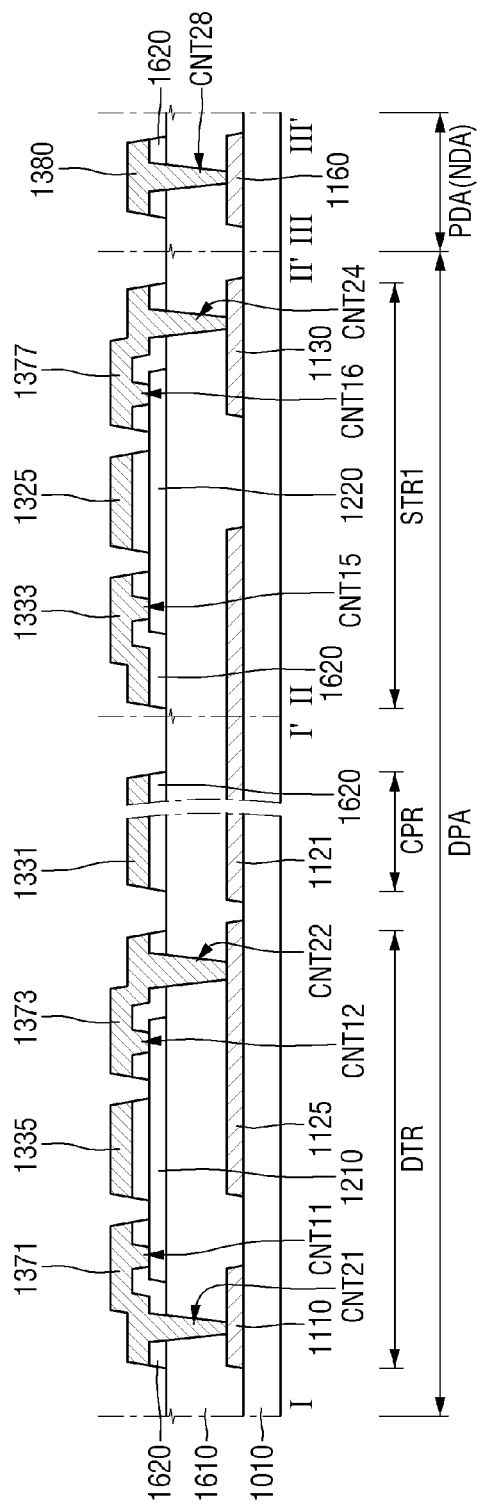

Thereafter, referring to FIG. 11, the second conductive layer 1300, which may be patterned, may be formed on the gate insulating film 1620. The second conductive layer 1300 may be formed by a mask process. For example, a material layer for forming the second conductive layer 1300 may be deposited on the entire surface of the gate insulating film 1620. The material layer for forming the second conductive layer 1300 may be deposited even on the inside of each of the contact holes (CNT11, CNT12, CNT15 CNT16, CNT21, CNT22, CNT24, and CNT28) to be electrically connected to the first conductive layer 1100 and the semiconductor layer 1200. Thereafter, a photoresist pattern may be formed by applying a photoresist layer on the material layer for forming the second conductive layer 1300 and subjecting the photoresist layer to exposure and development, and the material layer for forming the second conductive layer 1300 may be etched using the photoresist pattern as an etching mask. Thereafter, the photoresist pattern may be removed by a strip or ashing process, thereby forming the driving transistor first electrode 1371, the transistor shared electrode 1373, the driving transistor gate electrode 1335, the capacitor upper electrode 1331, the first switching transistor first electrode 1377, the first switching transistor second electrode 1333, the first switching transistor gate electrode 1325, and the pad electrode 1380, as illustrated in FIG. 11.

Figure 12:
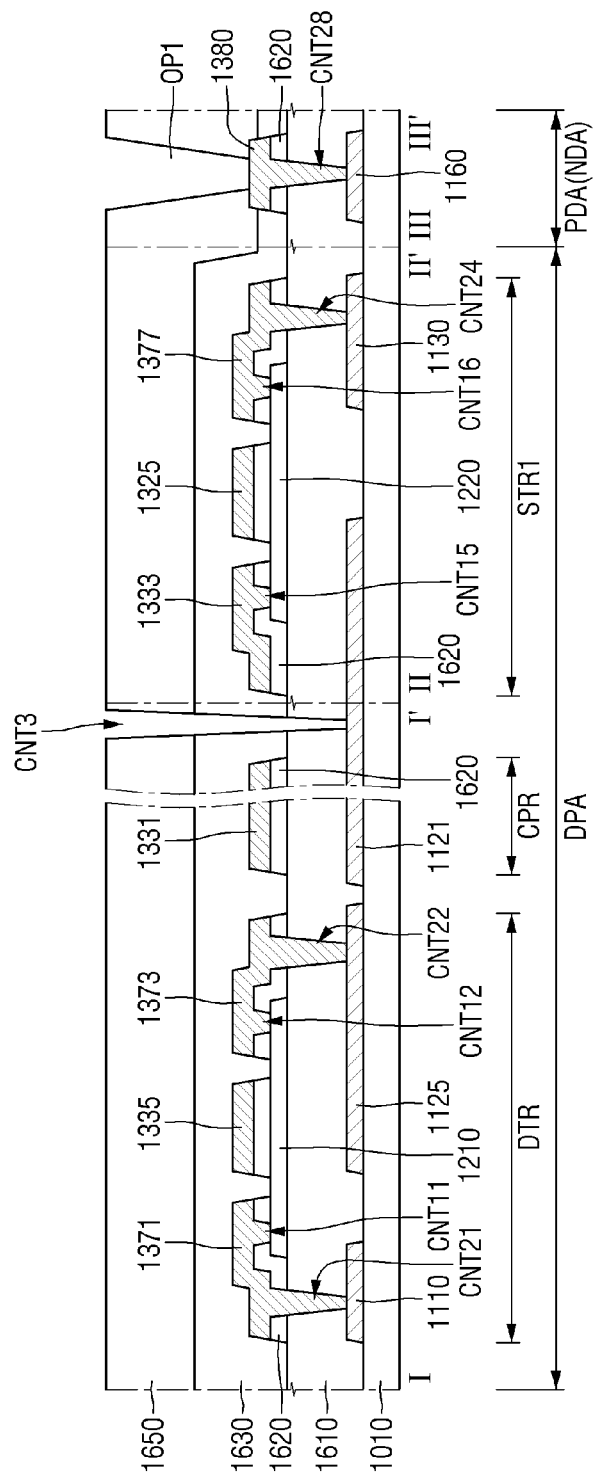

Thereafter, referring to FIG. 12, the passivation layer 1630 may be formed on the entire surface of the interlayer insulating film 1610 with the second conductive layer 1300 formed thereon, in the entire display area DPA except for the pad area PDA. Thereafter, the via layer 1650 may be deposited on the passivation layer 1630 and the pad electrode 1380. Thereafter, the contact hole CNT3, which may expose part of the capacitor lower electrode 1121, and a first opening OP1, which may expose part of the pad electrode 1380 in the pad area PDA, may be formed, thereby patterning the via layer 1650.

For example, the via layer 1650 may include an organic material containing a photosensitive material. In this example, the via layer 1650 may be formed and patterned by applying an organic material layer for forming the via layer 1650 and subjecting the material layer for forming the via layer 1650 to exposure and development. Accordingly, the via layer 1650, the contact hole CNT3, and the first opening OP1 may be formed by the same mask process.

Figure 13:
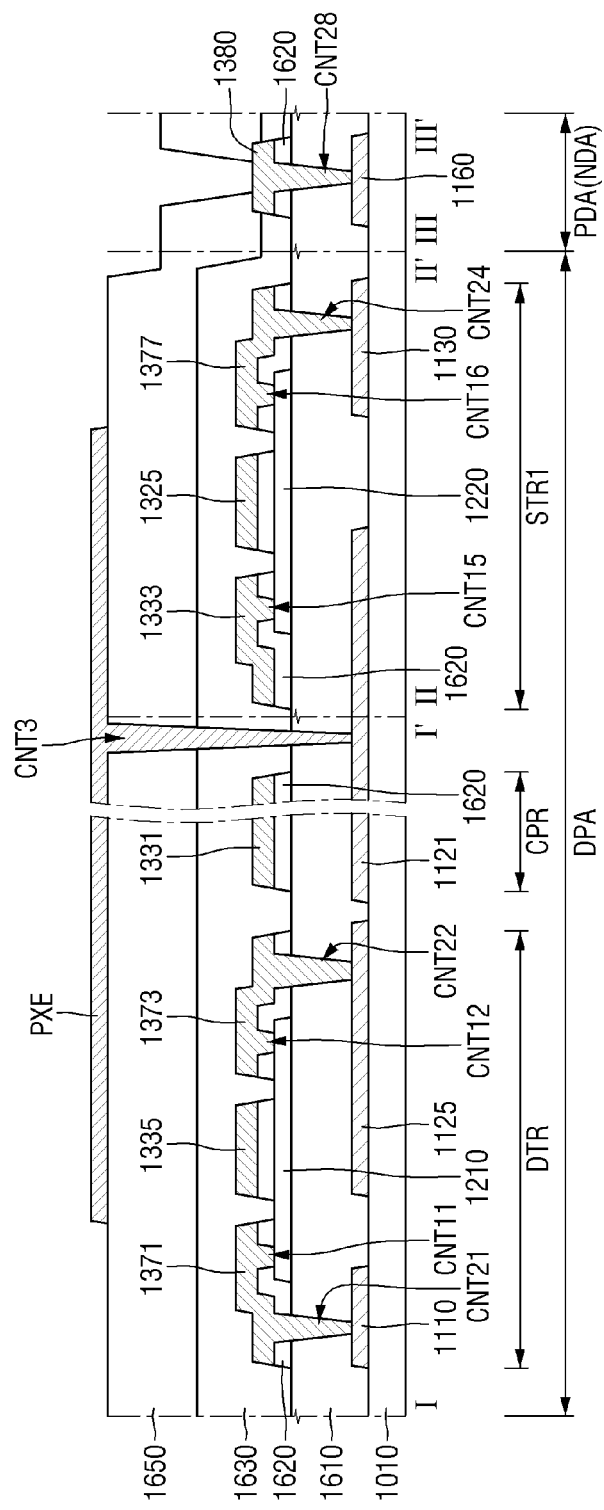

Thereafter, referring to FIG. 13, the pixel electrode PXE, which may be patterned is formed on the via layer 1650. The pixel electrode PXE may be formed by a mask process. For example, a material layer for forming the pixel electrode PXE may be deposited on the entire surface of the via layer 1650 in the display area PDA. The material layer for forming the pixel electrode PXE may be deposited even on the inside of the contact hole CNT3 to be electrically connected to the capacitor lower electrode 1121.

Thereafter, a photoresist pattern having a shape in which to form the pixel electrode PXE may be formed by applying a photoresist layer on the material layer for forming the pixel electrode PXE and subjecting the photoresist layer to exposure and development. Thereafter, the material layer for forming the pixel electrode PXE may be etched using the photoresist pattern as an etching mask. The material layer for forming the pixel electrode PXE may be etched by, for example, wet etching, but the disclosure is not limited thereto.

During etching, the pixel electrode PXE may be covered and protected by the photoresist pattern, but parts of the via layer 1650 not covered by the photoresist pattern may be exposed and may thus be partially etched. As a result, the height of the parts of the via layer 1650 not covered by the photoresist pattern may be reduced. Accordingly, the via layer 1650 may have a stepped structure having different heights in different regions. Thereafter, the photoresist pattern may be removed by an ashing or strip process, but the disclosure is not limited thereto.

Figure 14:
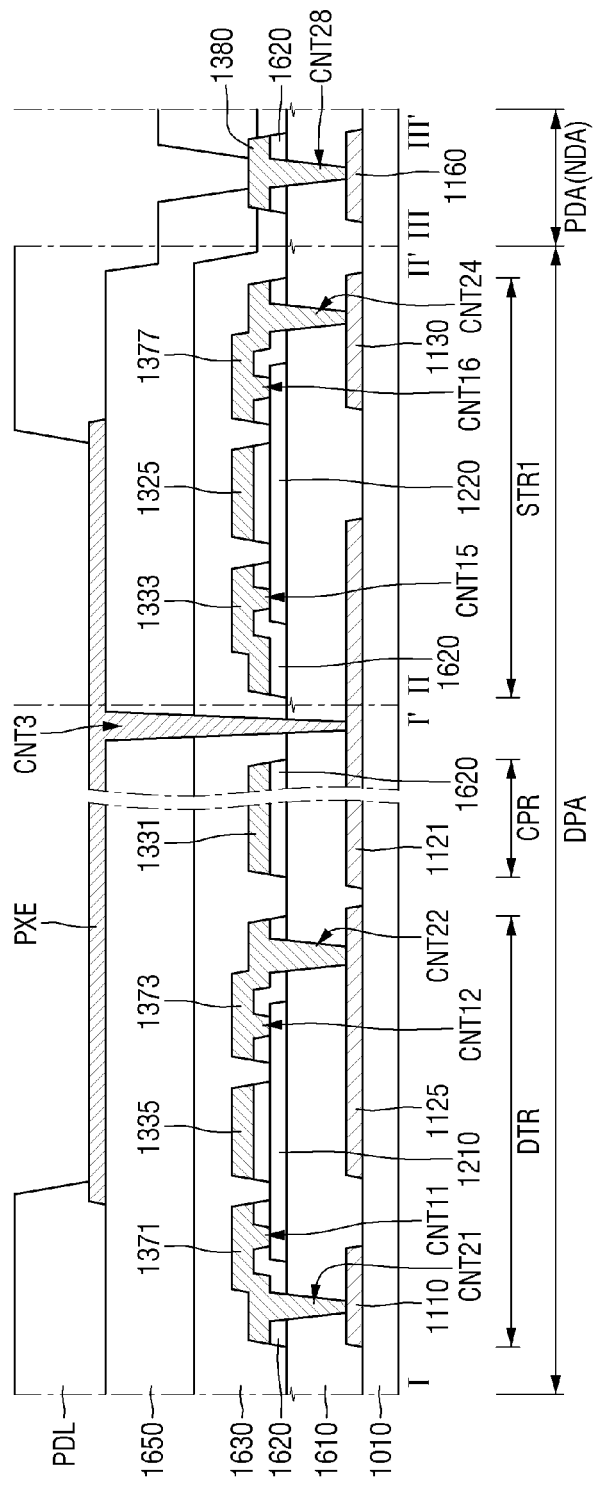

Thereafter, referring to FIG. 14, the pixel-defining film PDL, which may be patterned, may be formed on the via layer 1650 with the pixel electrode PXE formed thereon. For example, the pixel-defining film PDL may be formed of an organic material containing a photosensitive material. In this example, the pixel-defining film PDL may be formed by applying an organic material layer for forming the pixel-defining film PDL and subjecting the organic material layer to exposure and development.

The pixel-defining film PDL may be formed along the boundaries of the pixel PX and may partially overlap the pixel electrode PXE. The pixel-defining film PDL may fill parts of the via layer 1650 that may have a relatively small height and may thus compensate for height differences in the via layer 1650.

As described above, since the first conductive layer 1100 may be located or disposed below the semiconductor layer 1200, an additional mask process for forming a light-shielding layer below the channel region of the semiconductor layer 1200 may not be needed. For example, the first source/drain electrode, the second source/drain electrode, and the gate electrode of each of the transistors (DTR, STR1, and STR2) may be formed by a single mask process using the material layer for forming the second conductive layer 1300. Similarly, since the contact hole CNT3, which may penetrate the via layer 1650, the passivation layer 1630, and the interlayer insulating film 1610, may be formed using the same mask as that used to form the via layer 1650, an additional mask may not be needed.

Display devices according to other embodiments will hereinafter be described, focusing mainly on the differences with the display device 1.

Figure 15:
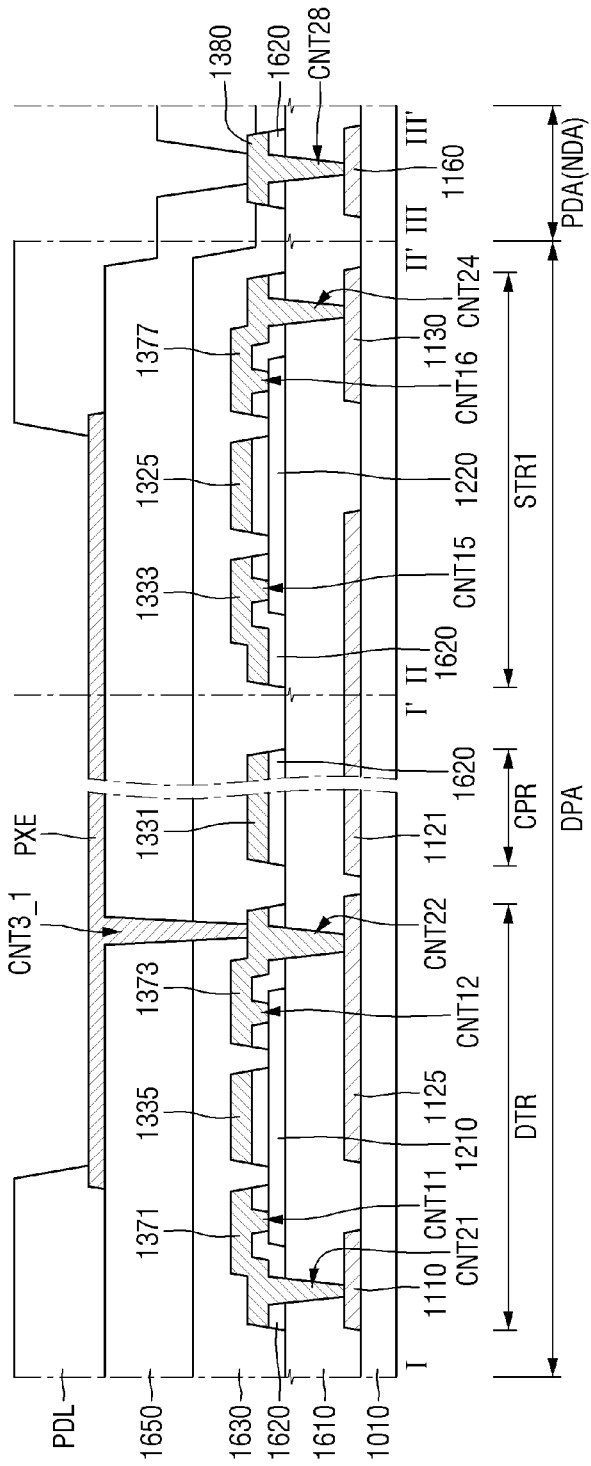
FIG. 15 is a schematic cross-sectional view of a pixel of a display device according to an embodiment.

FIG. 15 is a schematic cross-sectional view of a pixel of a display device according to an embodiment. FIG. 15 illustrates an example in which a pixel electrode PXE may be electrically connected to a transistor shared electrode 1373.

Referring to FIG. 15, a contact hole CNT3_1, which may penetrate a via layer 1650, may be located or disposed in a driving transistor region DTR. The contact hole CNT3_1 may be located or disposed to overlap the transistor shared electrode 1373, which may form the second source/drain electrode of a driving transistor DTR. The contact hole CNT3_1 may penetrate a passivation layer 1630 and a via layer 1650, which may be located or disposed on the transistor shared electrode 1373, to expose at least part of the transistor shared electrode 1373. The pixel electrode PXE may be deposited even on the inside of the contact hole CNT3_1 to be in contact with the top surface of the transistor shared electrode 1373. Accordingly, the pixel electrode PXE and the second source/drain electrode of the driving transistor DTR may be electrically connected.

In a mask process that may form the contact hole CNT3_1, the contact hole CNT3_1 and a first opening OP1 may be formed in the display area DPA and the non-display area NDA, respectively, using the same mask as that used to form the via layer 1650. In this case, in the embodiment of FIG. 7, the pad electrode 1380, which may be located or disposed in the non-display area NDA, may be exposed to an etchant while the interlayer insulating film 1610 may be etched to form the contact hole CNT3. In an embodiment of FIG. 15, since an interlayer insulating film 1610 may not need to be etched to form the contact hole CNT3_1, damage to the surface of a pad electrode 1380 in the non-display area NDA may be suppressed.

Figure 16:
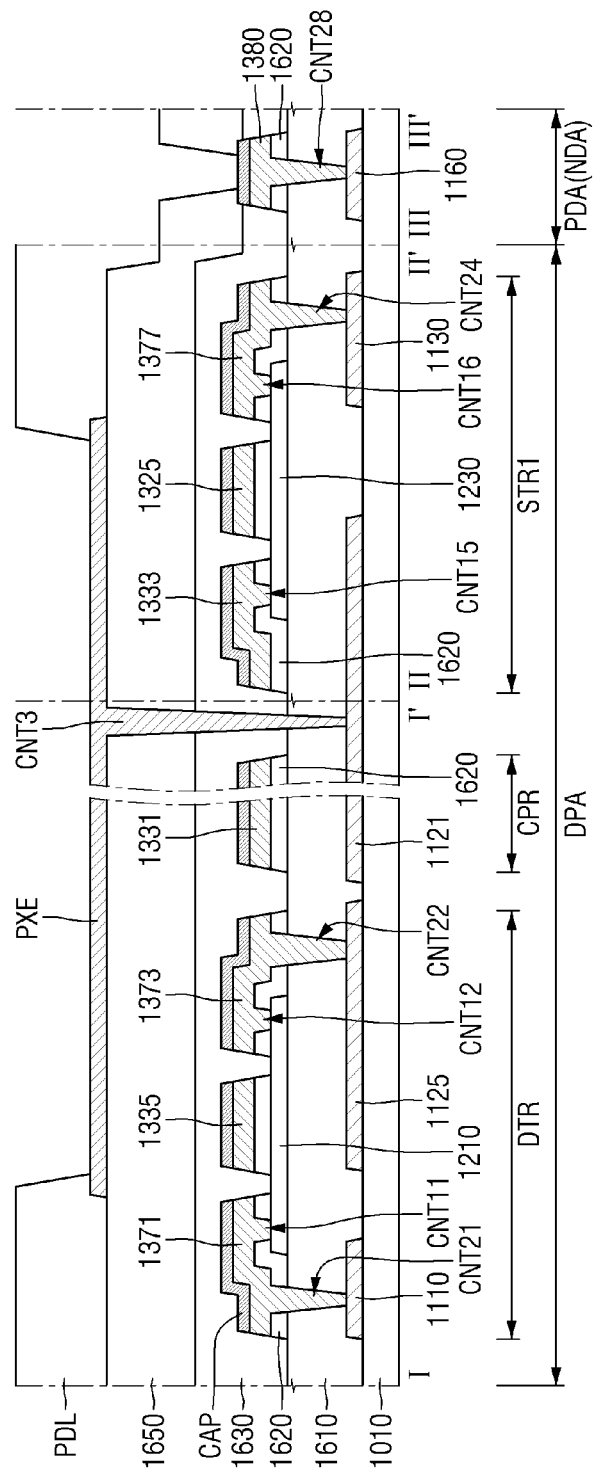
FIG. 16 is a schematic cross-sectional view of a pixel of a display device according to an embodiment.
Figure 17:
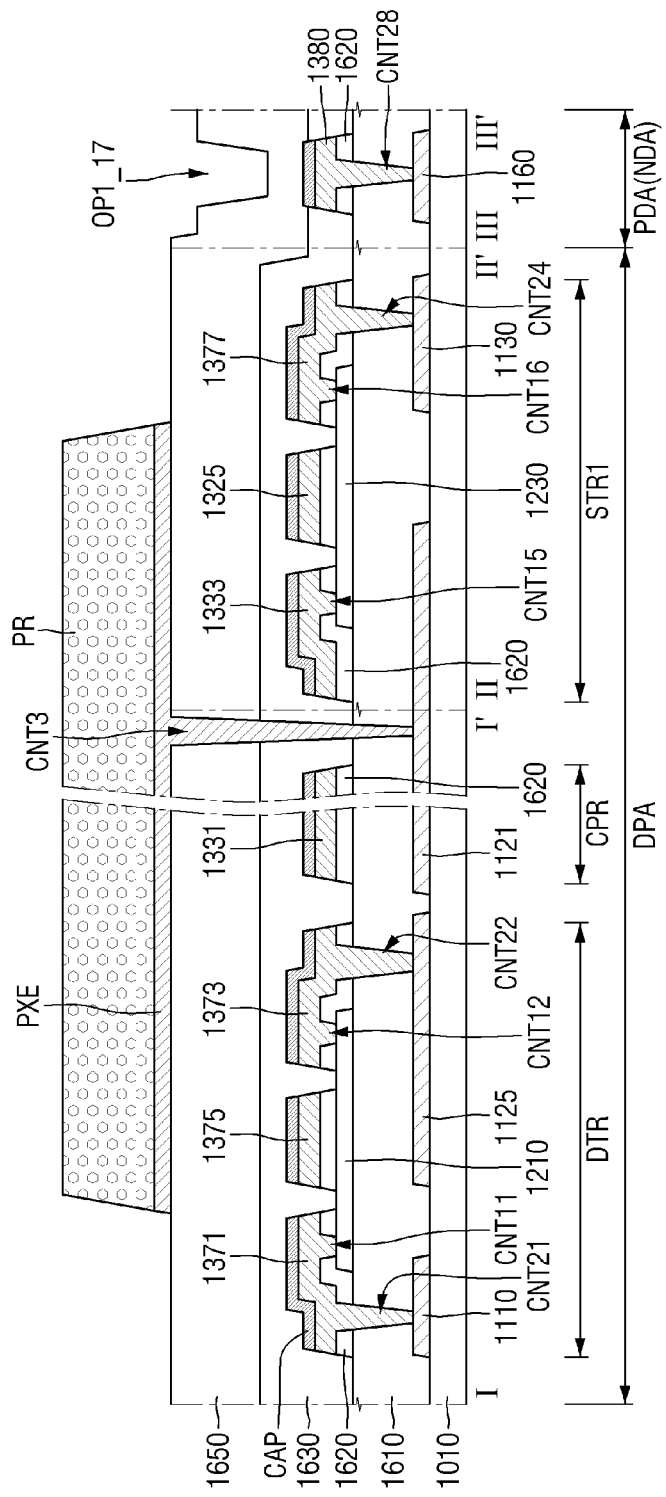
FIGS. 17 and 18 are schematic cross-sectional views illustrating a method of manufacturing the display device of FIG. 16.
Figure 18:
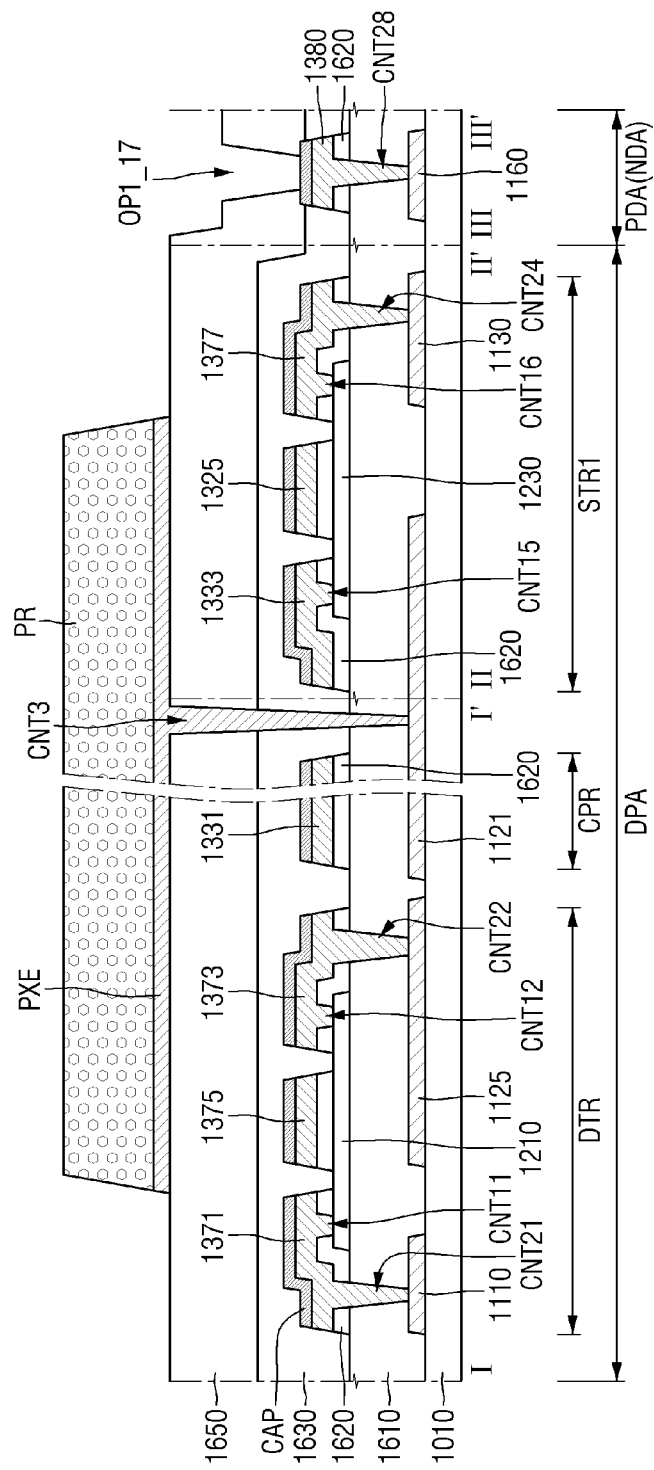

FIG. 16 is a schematic cross-sectional view of a pixel of a display device according to an embodiment. FIGS. 17 and 18 are schematic cross-sectional views illustrating a method of manufacturing the display device of FIG. 16. The embodiment of FIG. 16 may differ from the embodiment of FIG. 7 in that a conductive capping layer CAP may be located or disposed on a second conductive layer 1300.

Referring to FIG. 16, the conductive capping layer CAP may be located or disposed on the second conductive layer 1300. For example, the conductive capping layer CAP may be located or disposed on a driving transistor first electrode 1371, a driving transistor gate electrode 1375, a transistor shared electrode 1373, a capacitor upper electrode 1331, a first switching transistor first electrode 1377, a first switching transistor gate electrode 1325, a first switching transistor second electrode 1333, and a pad electrode 1380. The conductive capping layer CAP may cover and protect the second conductive layer 1300 from above the second conductive layer 1300. The conductive capping layer CAP may protect the second conductive layer 1300 from layers located or disposed on the second conductive layer 1300 or from etchants or other chemicals used in the manufacture of the display device of FIG. 16. The conductive capping layer CAP may be in direct contact with the second conductive layer 1300.

The conductive capping layer CAP, which may be located or disposed on the pad electrode 1380 in a pad area PDA, may be integrally formed with the pad electrode 1380 and may thus serve as the contact electrode of a wire pad WPD of a data signal line. Thus, the conductive capping layer CAP may be formed of a material suitable for use as the contact electrode of the wire pad WPD. The conductive capping layer CAP may include ZIO, IZO, or ITO. For example, the conductive capping layer CAP may include a ZIO film, an IZO film, or an ITO film or may be formed as a multilayer film of Ti/Mo/ITO. In an embodiment of FIG. 16, the second conductive layer 1300 may be a double-layer film of Ti/Cu, and the conductive capping layer CAP, which may be located or disposed on the second conductive layer 1300, may be an ITO film.

The second conductive layer 1300 and the conductive capping layer CAP may be patterned by a single mask process. For example, the sides of the second conductive layer 1300 and the sides of the conductive capping layer CAP may be aligned. The conductive capping layer CAP, which may be located or disposed on the second conductive layer 1300, may not protrude beyond the second conductive layer 1300. No insulating layer may be interposed between the second conductive layer 1300 and the conductive capping layer CAP.

Since the conductive capping layer CAP may be provided on the second conductive layer 1300, the second conductive layer 1300 may be prevented from being corroded in subsequent processes. Accordingly, the reliability of the wire pad WPD may be improved.

FIG. 17 is a schematic cross-sectional view illustrating the formation of a pixel electrode PXE as performed in the method of manufacturing the display device of FIG. 16.

The embodiment of FIG. 17 may differ from the embodiment of FIG. 14 in that an opening OP1_17, which may be located or disposed in the pad area PDA, covers the pad electrode 1380, and that the conductive capping layer CAP may be located or disposed on the pad electrode 1380.

Referring to FIG. 17, during the formation of a via layer 1650, which may be patterned, on a passivation layer 1630, a contact hole CNT3, which may be located or disposed in a display area DPA and exposes a capacitor lower electrode 1121, may be formed to penetrate the via layer 1650, the passivation layer 1630, and an interlayer insulating film 1610. The opening OP1_17 of the via layer 1650, which may be located or disposed in a non-display area NDA or the pad area PDA, may be formed to cover the conductive capping layer CAP, which may be located or disposed on the pad electrode 1380. The via layer 1650, which may have different heights in different regions, may be formed using a halftone mask or a slit mask, but the disclosure is not limited thereto.

A material layer for forming the pixel electrode PXE may be deposited on the entire surface of the via layer 1650 and may be etched using a photoresist pattern PR as an etching mask. At this stage, the pad electrode 1380 in the pad area PDA and the conductive capping layer CAP, which may be located or disposed on the pad electrode 1380, may be covered and protected by the via layer 1650 where the thickness of the via layer 1650 has been reduced. Thus, the pad electrode 1380 and the conductive capping layer CAP may be prevented from being damaged by being placed in contact with an etchant used to form the pixel electrode PXE.

Thereafter, referring to FIG. 18, etching may be performed with the photoresist pattern PR remaining on the pixel electrode PXE, thereby removing the via layer 1650 from above the conductive capping layer CAP in the pad area PDA to expose the conductive capping layer CAP on the pad electrode 1380. As a result, a pad opening which exposes the conductive capping layer CAP in the pad area PDA may be formed. Parts of the via layer 1650 that may form the pad opening may at least partially overlap the top surface of the conductive capping layer CAP. For example, the width of the pad opening may be smaller than the width of part of the conductive capping layer CAP located or disposed on the pad electrode 1380.

In an embodiment of FIG. 16, the conductive capping layer CAP, which may be formed together with the pad electrode 1380 by a single mask process, may be used as the contact electrode of a wire pad WPD. Accordingly, since an additional mask process for forming the contact electrode of the wire pad WPD may not be needed, process efficiency may be improved.

Meanwhile, during etching, the pixel electrode PXE may be covered and protected by the photoresist pattern, but the via layer 1650, which may not be covered by the photoresist pattern PR, may be exposed and may be partially etched. As a result, the height (or thickness) of parts of the via layer 1650 that may not be covered by the photoresist pattern PR may be reduced, and thus, the via layer 1650 may have a stepped structure having different heights in different regions.

Figure 19:
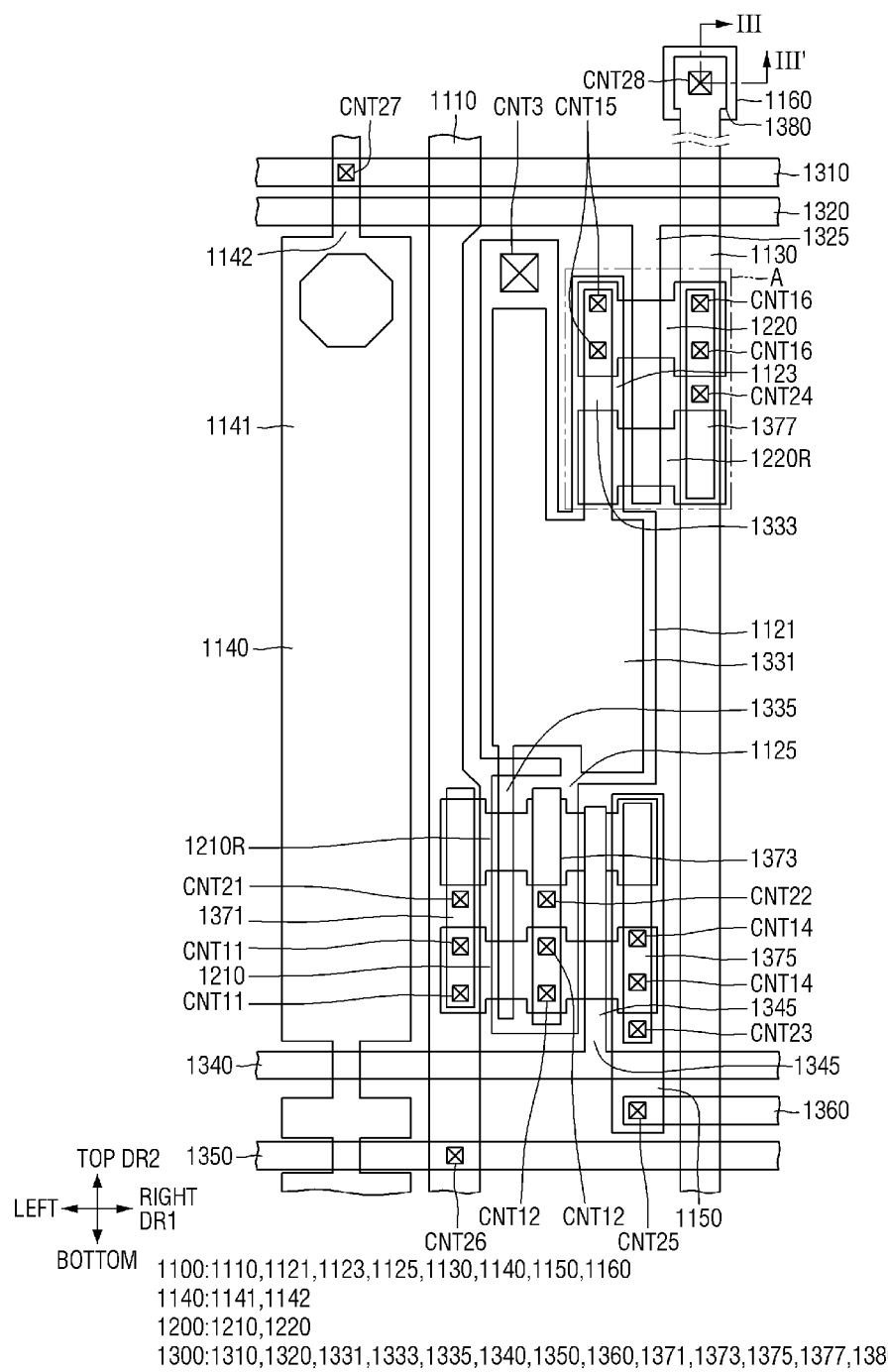
FIG. 19 is a layout view of a pixel of a display device according to an embodiment.
Figure 20:
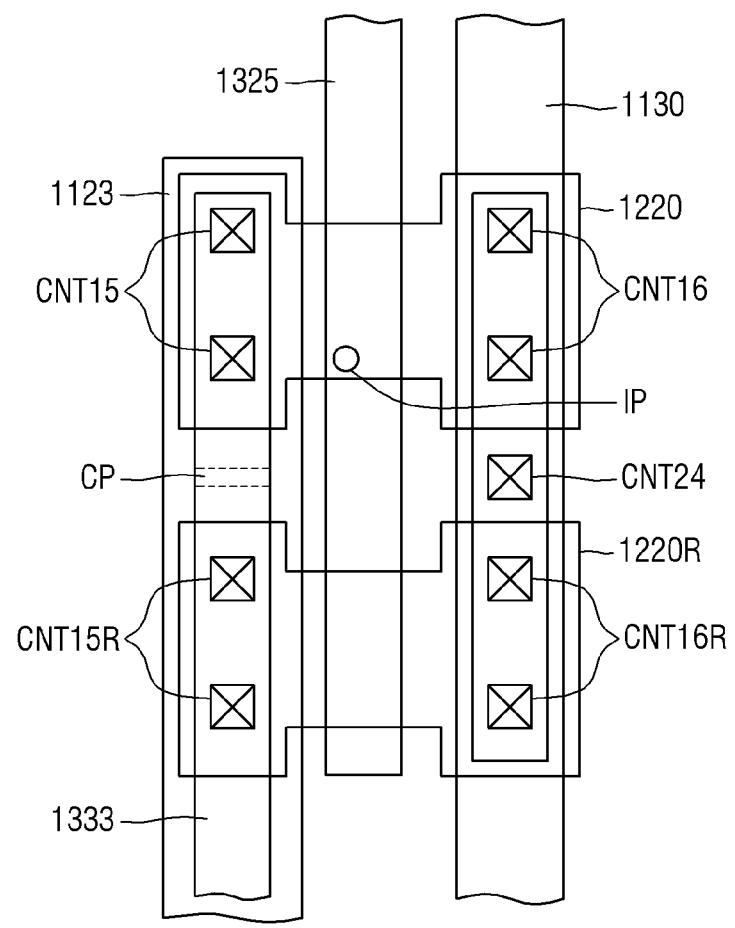
FIG. 20 is a cutout layout view illustrating a case where a defect has occurred in a transistor in a part A of FIG. 19.
Figure 21:
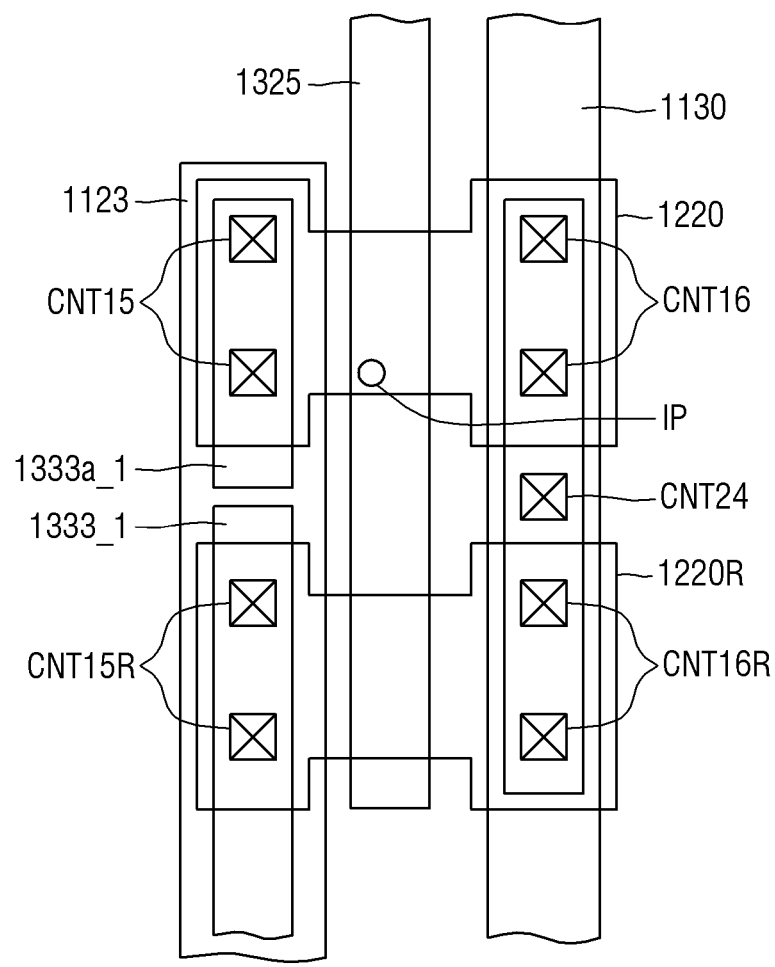
FIG. 21 is a cutout layout view illustrating a repair operation that may be performed when there exists a defect in the transistor in the part A of FIG. 19.

FIG. 19 is a layout view of a pixel of a display device according to an embodiment. FIG. 20 is a cutout layout view illustrating a case where a defect may have occurred in a transistor in a part A of FIG. 19. FIG. 21 is a cutout layout view illustrating a repair operation that may be performed when there may exist a defect in the transistor in the part A of FIG. 19.

The embodiment of FIG. 19 may differ from the embodiment of FIG. 5 in that in a plan view, semiconductor patterns having the same shape as first and second semiconductor patterns 1210 and 1220 that may form the active layers of transistors (DTR, STR1, and STR2) of a display device 1 may be provided on the upper side and/or the lower side of the first and second semiconductor patterns 1210 and 1220.

Referring to FIG. 19, in a plan view, a first redundancy semiconductor pattern 1210R may be located or disposed on the upper side of the first semiconductor pattern 1210 to be apart from the first semiconductor pattern 1210. The shape of the first redundancy semiconductor pattern 1210R may be substantially the same as the shape of the first semiconductor pattern 1210. The first redundancy semiconductor pattern 1210R may include the same or similar material as the first semiconductor pattern 1210. For example, the first redundancy semiconductor pattern 1210R may be substantially the same as the first semiconductor pattern 1210 in terms of shape, material, and stage of manufacture.

The arrangement of the first redundancy semiconductor pattern 1210R relative to first and second conductive layers 1100 and 1300 may be the same as the arrangement of the first semiconductor pattern 1210 relative to the first and second conductive layers 1100 and 1300. Thus, first, second, and third conductive regions of the first redundancy semiconductor pattern 1210R may be located or disposed to overlap a first power supply wire 1110, a capacitor lower electrode second extension 1125, and a reference voltage connecting electrode 1150 of the first conductive layer 1100. The first, second, and third conductive regions of the first redundancy semiconductor pattern 1210R may be located or disposed to overlap a driving transistor first electrode 1371, a transistor shared electrode 1373, and a second switching transistor first electrode 1375 of the second conductive layer 1300, and an extension of the first redundancy semiconductor pattern 1210R may be located or disposed to overlap a second switching transistor gate electrode 1345 and a driving transistor gate electrode 1335 of the second conductive layer 1300. In an embodiment of FIG. 19, the driving transistor first electrode 1371, the transistor shared electrode 1373, the driving transistor gate electrode 1335, the second switching transistor gate electrode 1345, and the second switching transistor first electrode 1375 of the second conductive layer 1300 extend in a second direction DR2 to overlap the first redundancy semiconductor pattern 1210R and the first semiconductor pattern 1210.

A gate insulating layer 1620 may be interposed between the first redundancy semiconductor pattern 1210R and the second conductive layer 1300. No contact holes may be formed in the gate insulating layer 1620, which may be interposed between the first redundancy semiconductor pattern 1210R and the second conductive layer 1300. Thus, in a schematic cross-sectional view, the first redundancy semiconductor pattern 1210R and the second conductive layer 1300 may be electrically insulated from each other.

Similarly, in a plan view, a second redundancy semiconductor pattern 1220R may be located or disposed on the lower side of the second semiconductor pattern 1220 to be apart from the second semiconductor pattern 1220. The shape of the second redundancy semiconductor pattern 1220R may be substantially the same as the shape of the second semiconductor pattern 1220. Also, the second redundancy semiconductor pattern 1220R may include the same or similar material as the second semiconductor pattern 1220. For example, the second redundancy semiconductor pattern 1220R may be substantially the same as the second semiconductor pattern 1220 in terms of shape, material, and stage of manufacture.

The arrangement of the second redundancy semiconductor pattern 1220R relative to the first and second conductive layers 1100 and 1300 may be the same as the arrangement of the second semiconductor pattern 1220 relative to the first and second conductive layers 1100 and 1300. Thus, first and second conductive regions of the second redundancy semiconductor pattern 1220R may be located or disposed to overlap a capacitor lower electrode second extension 1123 and a data signal line 1130 of the first conductive layer 1100. The first and second conductive regions and an extension of the second redundancy semiconductor pattern 1220R may be located or disposed to overlap a first switching transistor second electrode 1333, a first switching transistor gate electrode 1325, and a first switching transistor first electrode 1377 of the second conductive layer 1300.

In an embodiment of FIG. 19, the first switching transistor second electrode 1333, the first switching transistor gate electrode 1325, and the first switching transistor first electrode 1377 of the second conductive layer 1300 may extend in the second direction DR2 to overlap the second redundancy semiconductor pattern 1220R and the second semiconductor pattern 1220.

The gate insulating layer 1620 may also be interposed between the second redundancy semiconductor pattern 1220R and the second conductive layer 1300. No contact holes may be formed in the gate insulating layer 1620, which may be interposed between the first redundancy semiconductor pattern 1220R and the second conductive layer 1300. Thus, in a schematic cross-sectional view, the second redundancy semiconductor pattern 1220R and the second conductive layer 1300 may be electrically insulated from each other.

If defects occur during the manufacture of the display device 1, the first and second redundancy semiconductor patterns 1210R and 1220R may replace the first and second semiconductor patterns 1210 and 1220 and may be used as the active layers of the transistors of the display device 1.

For example, if a foreign material IP remains on the channel region of the semiconductor layer 1200 or in the gate electrode of a transistor during the manufacture of the display device 1, a defect may occur due to the foreign material IP. Examples of the foreign material IP include an insulating material. In a case where a defect occurs in a transistor, the first source/drain electrode and/or the second source/drain electrode of the transistor may be cut off so that no signals may be applied to the transistor.

Referring to FIG. 20, if the foreign material IP remains on the extension of the second semiconductor pattern 1220 or on the first switching transistor gate electrode 1325, a defect may occur in a first switching transistor STR1 due to the foreign material IP. In this case, a cutting region CP on the first switching transistor second electrode 1333, which may be in contact with, and electrically connected to, the second source/drain region of the second semiconductor pattern 1220, may be cut, thereby repairing the defect. The cutting region CP may be a region on the first switching transistor second electrode 1333 that may not overlap the second semiconductor pattern 1220 and the second redundancy semiconductor pattern 1220R. For example, the cutting region CP may correspond to a region on the first switching transistor second electrode 1333 where the second semiconductor pattern 1220 and the second redundancy semiconductor pattern 1220R may be spaced apart from each other. The cutting region CP may be cut by a laser, by way of example.

Referring to FIG. 21, the first switching transistor second electrode 1333, which may be located or disposed on the second semiconductor pattern 1220 where a defect may have occurred, may be cut, by a laser, into a first switching transistor defective second electrode 1333a_1 and a first switching transistor second electrode 1333_1, which may be apart from each other.

Thereafter, since the gate insulating layer 1620 may be interposed between the second redundancy semiconductor pattern 1220R and the first switching transistor second electrode 1333_1, contact holes (CNT15R and CNT16R) may be formed using a laser so that the second redundancy semiconductor pattern 1220R, the first switching transistor second electrode 1333_1, and the first switching transistor first electrode 1337 may be electrically connected. In this case, the second redundancy semiconductor pattern 1220R may be a new active layer of the first switching transistor STR1. The first switching transistor second electrode 1333 may be cut by a laser, but the disclosure is not limited thereto. Alternatively, if the first switching transistor STR1 is defective, signals may be transmitted to the first switching transistor first electrode 1377. In this case, part of the first switching transistor first electrode 1377 between a contact hole CNT24, which may electrically connect the data signal line 1130 and the first switching transistor first electrode 1377 and the data signal line 1130, and contact holes CNT16, which may be located or disposed at the right end of the second semiconductor pattern 1220, may be cut. As a result, no data signals may be applied to the first switching transistor first electrode 1377, which may be located or disposed at the right end of the second semiconductor pattern 1220.

Figure 22:
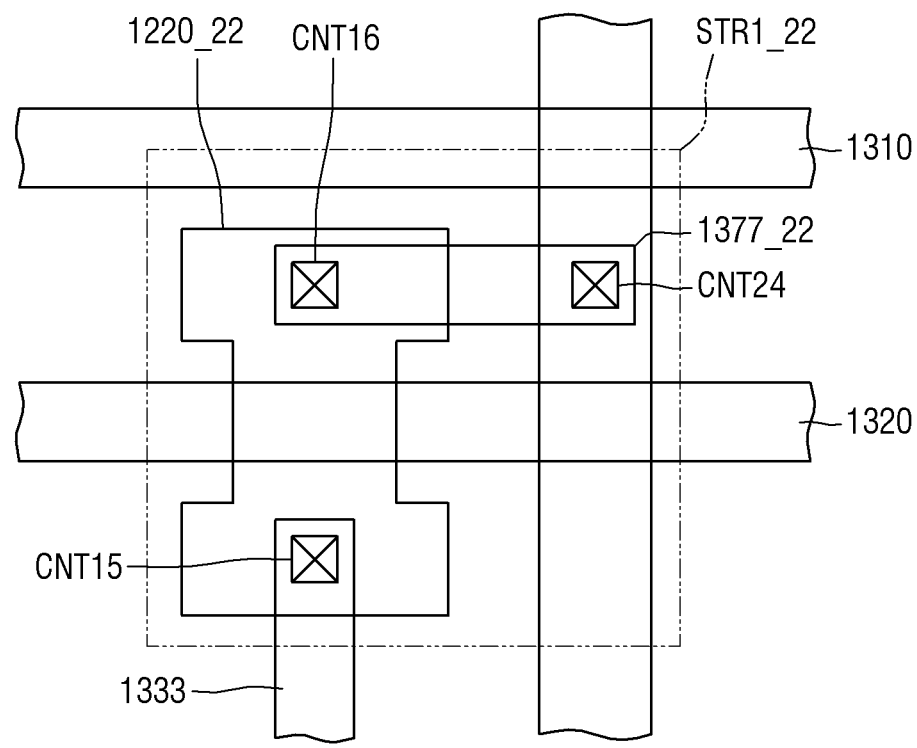
FIG. 22 is a cutout layout view of a first switching transistor region of a pixel of a display device according to an embodiment.

FIG. 22 is a cutout layout view of a first switching transistor region of a pixel of a display device according to an embodiment.

The embodiment of FIG. 22 may differ from the embodiment of FIG. 5 in that a first switching transistor gate electrode 1325, which may branch off from a scan signal line 1320 and extend in a second direction DR2, may not be provided.

Referring to FIG. 22, a second semiconductor pattern 1220_22, which may be located or disposed in a first switching transistor region STR1_22, may generally extend in the second direction DR2, and both end parts of the second semiconductor pattern 1220_22 may be expanded in a first direction DR1 to be wider than the rest of the second semiconductor pattern 1220_22. For example, the second semiconductor pattern 1220_22 may include a first conductive region which may be located or disposed on a first side of or a part of the second semiconductor pattern 1220_22, a second conductive region which may be located or disposed on a second side of the second semiconductor pattern 1220_22 that may be opposite to the first side of or a part of the second semiconductor pattern 1220_22, and an extension which may connect the first and second conductive regions. For example, the first and second sides of the second semiconductor pattern 1220_22 may be the upper and lower sides, respectively, of the second semiconductor pattern 1220_22. Accordingly, the first conductive region of the second semiconductor pattern 1220_22 may be located or disposed on the upper side of the extension of the second semiconductor pattern 1220_22, and the second conductive region of the second semiconductor pattern 1220_22 may be located or disposed on the lower side of the extension of the second semiconductor pattern 1220_22.

The extension of the second semiconductor pattern 1220_22 and the scan signal line 1320 may be located or disposed to overlap each other. Part of the extension of the second semiconductor pattern 1220_22 that may overlap the scan signal line 1320 may be the channel region of a first switching transistor STR1, and part of the scan signal line 1320 that may overlap the extension of the second semiconductor pattern 1220_22 may be the gate electrode of the first switching transistor STR1. For example, the scan signal line 1320 may include the gate electrode of the first switching transistor STR1.

The first conductive region of the second semiconductor pattern 1220_22 may be the first source/drain region of the first switching transistor STR1, and the second conductive region of the second semiconductor pattern 1220_22 may be the second source/drain region of the first switching transistor STR1. The first conductive region of the second semiconductor pattern 1220_22 may not overlap a data signal line 1130. The first conductive region of the second semiconductor pattern 1220_22 and the data signal line 1130 may be electrically connected via a first switching transistor first electrode 1377_22 and contact holes (CNT16 and CNT24). FIG. 22 illustrates the second semiconductor pattern 1220_22, but the description of the second semiconductor pattern 1220_22 may be directly applicable to a first semiconductor pattern (not illustrated).

In a case where a defect occurs in each of transistors (DTR, STR1, and STR2) of a pixel PX, the first source/drain electrode and/or the first source/drain electrode of each of the transistors (DTR, STR1, and STR2) may be cut by a laser. In this case, a cutting space may be needed for cutting the first source/drain electrode and/or the first source/drain electrode of each of the transistors (DTR, STR1, and STR2). The width of the cutting space may preferably be in a range of about 6 μm to about 8 μm to properly cut the first source/drain electrode and/or the first source/drain electrode of each of the transistors (DTR, STR1, and STR2).

In an embodiment of FIG. 22, the extension of the second semiconductor pattern 1220_22 may be arranged substantially in parallel to the second direction DR2 so that the first conductive region of the second semiconductor pattern 1220_22 may be spaced apart from the data line 1130. Accordingly, a sufficient cutting space may be secured. For example, since a semiconductor layer 1200 may be formed to be substantially perpendicular to multiple lines located or disposed in the first conductive layer 1100, a sufficient cutting space may be secured for cutting wires in the second conductive layer 1300 that may be connected to the first source/drain electrode and/or the first source/drain electrode of each of the transistors (DTR, STR1, and STR2), in case a defect occurs.

Figure 23:
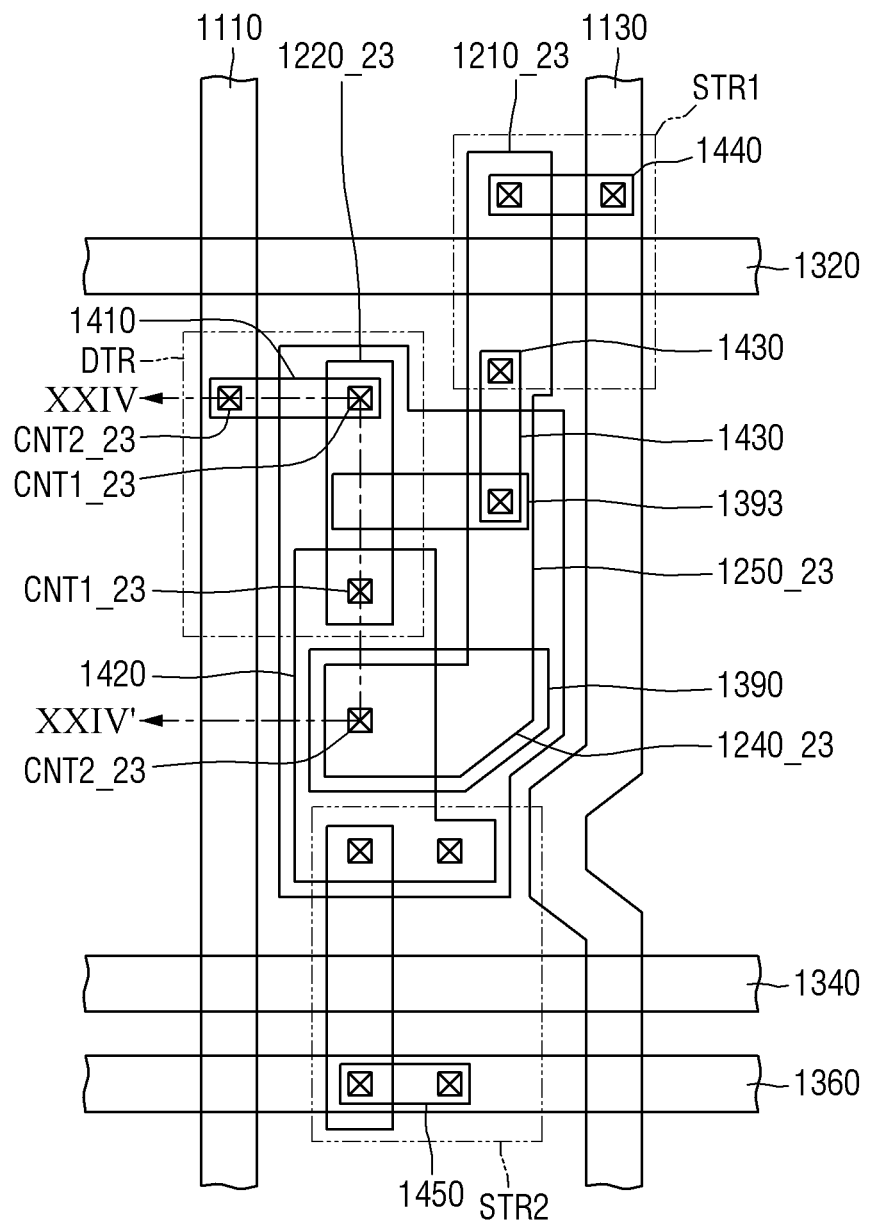
FIG. 23 is a layout view of a pixel of a display device according to an embodiment.
Figure 24:
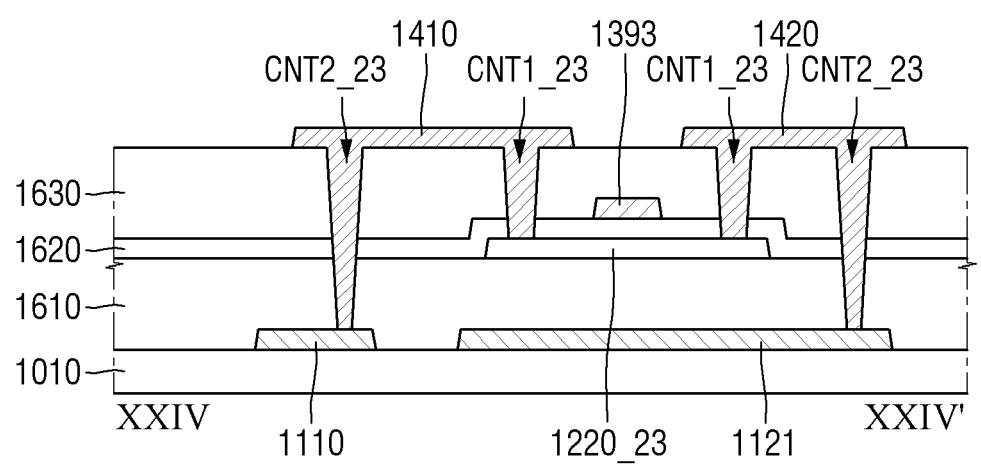
FIG. 24 is a schematic cross-sectional view taken along line XXIV-XXIV' of FIG. 23.

FIG. 23 is a layout view of a pixel of a display device according to an embodiment. FIG. 24 is a schematic cross-sectional view taken along line XXIV-XXIV' of FIG. 23.

The embodiment of FIGS. 23 and 24 may differ from the embodiment of FIG. 22 in that the first source/drain electrodes and/or the second source/drain electrodes of transistors (DTR, STR1, and STR2) may be formed of a different conductive layer from the gate electrodes of the transistors (DTR, STR1, and STR2). In the embodiment of FIG. 23, similar to the embodiment of FIG. 22, extensions of a semiconductor layer 1200 may be arranged substantially in parallel to a first conductive layer 1100 to be substantially perpendicular to a scan signal line 1320 and a sensing signal line 1340 of a second conductive layer 1300. The embodiment of FIG. 23 will hereinafter be described, focusing mainly on the differences with the embodiment of FIG. 22.

Referring to FIGS. 23 and 24, a gate insulating layer 1620 may be located or disposed on the entire surface of a first interlayer insulating film 1610. Gate electrodes may be located or disposed on the gate insulating layer 1620 to overlap the extensions of the semiconductor pattern layer 1200. A second interlayer insulating film 1630 may be located or disposed on the gate insulating layer 1620. A third conductive layer 1400 may be located or disposed on the second interlayer insulating film 1630. The third conductive layer 1400 may be in contact with first source/drain regions and/or second source/drain regions of the semiconductor layer 1200 via contact holes or with part of the first conductive layer 1100. Accordingly, the third conductive layer 1400 may be electrically connected to the semiconductor layer 1200 via contact holes which may penetrate the first interlayer insulating film 1610, the gate insulating layer 1620, and the second interlayer insulating film 1630 to expose the first conductive layer 1100 and via contact holes which may penetrate the gate insulating layer 1620 and the second interlayer insulating film 1630 to expose the first source/drain regions and/or the second source/drain regions of the semiconductor layer 1200.

For example, referring to FIG. 24, a driving transistor first electrode 1410 and a driving transistor second electrode 1420 in a driving transistor region DTR may be located or disposed on a driving transistor gate electrode 1393. The driving transistor first electrode 1410 may be electrically connected to a second semiconductor pattern 1220_23 via a contact hole CNT1_23 which may penetrate the second interlayer insulating film 1630 and the gate insulating film 1620, and the driving transistor first electrode 1410 may be electrically connected to a first power supply wire 1110 via a contact hole CNT2_23 which may penetrate the second interlayer insulating film 1630, the gate insulating film 1620, and the first interlayer insulating film 1610. Accordingly, the driving transistor first electrode 1410 and the driving transistor gate electrode 1393 may be formed by separate mask processes.

In concluding the detailed description, those skilled in the art will appreciate that many variations and modifications may be made to the embodiments without substantially departing from the principles and spirit and scope of the disclosure. Therefore, the disclosed embodiments are used in a generic and descriptive sense only and not for purposes of limitation.

What is claimed is:

1. A display device comprising:
   a substrate;
   a first conductive layer disposed on the substrate, the first conductive layer including a data signal line and a capacitor lower electrode;
   an interlayer insulating film disposed on the first conductive layer;
   a semiconductor layer disposed on the interlayer insulating film, the semiconductor layer including a first semiconductor pattern;
   a gate insulating film disposed on the semiconductor layer;
   a second conductive layer disposed on the gate insulating film, the second conductive layer including:
      a capacitor upper electrode overlapping the capacitor lower electrode;
      a gate electrode of a first transistor disposed to overlap the first semiconductor pattern;
      a first electrode of the first transistor disposed to overlap a part of the first semiconductor pattern, wherein the first electrode of the first transistor is electrically connected to the data signal line through a first contact hole that penetrates the interlayer insulating film and the gate insulating film; and
      a second electrode of the first transistor disposed to overlap another part of the first semiconductor pattern; and
   a third insulating layer disposed on the second conductive layer, wherein the gate electrode of the first transistor, the first electrode of the first transistor, the second electrode of the first transistor, and the capacitor upper electrode are disposed between the gate insulating film and the third insulating layer, and
   a pixel electrode disposed on the third insulating layer, wherein
   a second contact hole that penetrates the third insulating layer, the interlayer insulating film and the gate insulating film is defined to expose a portion of the capacitor lower electrode and
   the pixel electrode is in direct contact with the portion of the capacitor lower electrode through the second contact hole.

2. The display device of claim 1, wherein
   the second conductive layer further includes a scan signal line, and
   the gate of the first transistor branches off from the scan signal line.

3. The display device of claim 2, wherein
   the data signal line extends in a first direction, and
   the scan signal line extends in a second direction that intersects the first direction.

4. The display device of claim 3, wherein the gate electrode of the first transistor extends in the first direction.

5. The display device of claim 2, wherein the first conductive layer further includes a data pad at an end of the data signal line.

6. The display device of claim 5, wherein the second conductive layer further includes a pad electrode that overlaps the data pad.

7. The display device of claim 6, wherein the pad electrode is electrically connected to the data pad through a third contact hole that penetrates the interlayer insulating film and the gate insulating film.

8. The display device of claim 6, further comprising a conductive capping layer disposed on the second conductive layer, the conductive capping layer being arranged directly on each of the gate electrode of the first transistor, the first electrode of the first transistor and the second electrode of the first transistor.

9. The display device of claim 8, wherein the conductive capping layer includes a ZIO film, an IZO film, an ITO film, or a Ti/Mo/ITO film.

10. The display device of claim 8, wherein the conductive capping layer is arranged on the pad electrode, the pad electrode is in electrical contact with the conductive capping layer.

11. The display device of claim 8, wherein the pad electrode is formed integrally with the conductive capping layer.

12. The display device of claim 1, wherein the gate electrode of the first transistor, the first electrode of the first transistor, and the second electrode of the first transistor are spaced apart from one another.

13. The display device of claim 1, wherein the first electrode of the first transistor is electrically connected to the part of the first semiconductor pattern through a fourth contact hole that penetrates the gate insulating film.

14. The display device of claim 1, wherein the semiconductor layer further includes a second semiconductor pattern disposed apart from the first semiconductor pattern.

15. The display device of claim 14, wherein
the first conductive layer further includes a first power supply wire, and
the first power supply wire is disposed to overlap a part of the second semiconductor pattern and is electrically connected to the part of the second semiconductor pattern through the first contact hole that penetrates the interlayer insulating film and the gate insulating film.

16. The display device of claim 6, wherein
the data signal line and the first power supply wire extend in a first direction, and
the scan signal line extends in a second direction that intersects the first direction.

17. A display device comprising:
a substrate;
a first conductive layer disposed on the substrate;
an interlayer insulating film disposed on the first conductive layer;
a semiconductor layer disposed on the interlayer insulating film;
a gate insulating film disposed on the semiconductor layer;
a second conductive layer disposed on the gate insulating film;
a third insulating layer disposed on the second conductive layer;
a third conductive layer disposed on the third insulating layer;
a light-emitting element disposed in pixels;
a driving transistor providing a driving current to the light-emitting element; and
a first switching transistor transmitting a data signal to a gate electrode of the driving transistor, wherein
the first conductive layer includes:
a first power supply wire electrically connected to a first electrode of the driving transistor;
a data signal line electrically connected to a first electrode of the first switching transistor; and
a capacitor lower electrode,
the semiconductor layer includes
a first semiconductor pattern that overlaps the first power supply wire; and
a second semiconductor pattern apart from the first semiconductor pattern,
the second conductive layer includes:
the first electrode of the first switching transistor;
the first electrode of the driving transistor;
a scan signal line that transmits a scan signal to a gate electrode of the first switching transistor; and
a capacitor upper electrode overlapping the capacitor lower electrode, and
the gate electrode of the first switching transistor, the first electrode of the first switching transistor, and a second electrode of the first switching transistor are disposed between the gate insulating film and the third insulating layer,
a first contact hole that penetrates the third insulating layer, the interlayer insulating film and the gate insulating film is defined to expose a portion of the capacitor lower electrode and
the third conductive layer is in direct contact with the portion of the capacitor lower electrode through the first contact hole.

18. The display device of claim 17, wherein a part of the second semiconductor pattern overlaps the data signal line.

19. The display device of claim 17, further comprising:
a second switching transistor transmitting a reference voltage to a second electrode of the driving transistor, wherein
the second conductive layer further includes a sensing signal line which transmits the sensing signal to a gate electrode of the second switching transistor.

20. The display device of claim 17, wherein the third conductive layer is electrically connected to the first electrode of the driving transistor through a second contact hole that penetrates the third insulating layer.

* * * * *